United States Patent
Funatsu et al.

(10) Patent No.: US 9,525,835 B2
(45) Date of Patent: Dec. 20, 2016

(54) SOLID-STATE IMAGE PICKUP DEVICE AND CAMERA SYSTEM

(71) Applicant: Sony Corporation, Tokyo (JP)

(72) Inventors: Eiichi Funatsu, Tokyo (JP); Hiroaki Ebihara, Kanagawa (JP); Yoshiharu Kudoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 97 days.

(21) Appl. No.: 13/948,850

(22) Filed: Jul. 23, 2013

(65) Prior Publication Data

US 2013/0308008 A1 Nov. 21, 2013

Related U.S. Application Data

(63) Continuation of application No. 12/698,326, filed on Feb. 2, 2010, now Pat. No. 8,520,105.

(30) Foreign Application Priority Data

Feb. 9, 2010 (JP) .................................. 2009-027895

(51) Int. Cl.
*H04N 5/374* (2011.01)
*H01L 27/146* (2006.01)

(52) U.S. Cl.
CPC ........ *H04N 5/374* (2013.01); *H01L 27/14609* (2013.01); *H01L 27/14641* (2013.01); *H01L 27/14656* (2013.01)

(58) Field of Classification Search
CPC .. H04N 5/23232; H04N 5/2355; H04N 5/353; H04N 5/35536; H04N 5/35581; H04N 5/374; H04N 5/378; H04N 5/37457; H04N 5/35554; H04N 3/1556; H04N 9/045; H01L 27/14609; H01L 27/14656; H01L 27/14641
USPC .................................................. 348/294–324
See application file for complete search history.

(56) References Cited

U.S. PATENT DOCUMENTS 5,903,249 A * 5/1999 Koyama et al. ................ 345/92
6,002,123 A * 12/1999 Suzuki ................. H04N 5/3745
250/208.1
6,051,447 A 4/2000 Lee et al.
(Continued)

FOREIGN PATENT DOCUMENTS

EP 1096790 5/2001
EP 1223623 7/2002
(Continued)

OTHER PUBLICATIONS

European Search Report issued in connection with counterpart EP application No. EP 10250118.6 dated Mar. 2, 2012.
(Continued)

*Primary Examiner* — Pritham Prabhakher
(74) *Attorney, Agent, or Firm* — Chip Law Group

(57) ABSTRACT

A solid-state image pickup device including a pixel unit in which a plurality of photoelectric conversion elements having different sensitivities are arranged; and a pixel reading unit configured to read and add output signals from the plurality of photoelectric conversion elements in the pixel unit, and to obtain an output signal seemingly from one pixel. The pixel unit includes an absorbing unit configured to absorb overflowing electric charge from a photoelectric conversion element with a high sensitivity.

26 Claims, 31 Drawing Sheets

(56) References Cited

U.S. PATENT DOCUMENTS

| | | | |
|---|---|---|---|
| 6,352,869 B1* | 3/2002 | Guidash | H01L 27/14603 257/231 |
| 6,727,521 B2* | 4/2004 | Merrill | H01L 27/14647 257/294 |
| 6,791,614 B1* | 9/2004 | Kimura | H01L 27/14683 257/229 |
| 7,259,790 B2* | 8/2007 | Mabuchi | H01L 27/14609 257/292 |
| 7,636,115 B2* | 12/2009 | Hong et al. | 348/294 |
| 7,773,138 B2* | 8/2010 | Lahav et al. | 348/280 |
| 2002/0190229 A1* | 12/2002 | Nakamura | G06K 9/00013 250/556 |
| 2006/0065915 A1* | 3/2006 | Kuwazawa | H01L 27/14603 257/292 |
| 2006/0208292 A1* | 9/2006 | Itano | H01L 27/14603 257/292 |
| 2007/0035653 A1* | 2/2007 | Hong et al. | 348/340 |
| 2007/0084986 A1* | 4/2007 | Yang | H01L 27/14603 250/208.1 |
| 2007/0272828 A1* | 11/2007 | Xu | H04N 5/361 250/208.1 |
| 2008/0062290 A1* | 3/2008 | Lahav et al. | 348/280 |
| 2008/0309840 A1* | 12/2008 | Yen et al. | 349/48 |
| 2009/0053848 A1* | 2/2009 | Fan | H01L 27/14603 438/59 |
| 2009/0273697 A1* | 11/2009 | Sonoda | H04N 5/35554 348/302 |
| 2009/0290059 A1* | 11/2009 | Suzuki | H01L 27/14603 348/308 |
| 2009/0303371 A1* | 12/2009 | Watanabe et al. | 348/311 |
| 2009/0309999 A1* | 12/2009 | Hirai | H04N 5/3559 348/241 |
| 2010/0013969 A1* | 1/2010 | Ui | H04N 5/35545 348/294 |
| 2010/0020209 A1* | 1/2010 | Kim | H04N 3/155 348/294 |
| 2010/0066877 A1* | 3/2010 | Yamaguchi | H01L 27/14603 348/279 |
| 2010/0277607 A1* | 11/2010 | Choi | H04N 5/35554 348/222.1 |

FOREIGN PATENT DOCUMENTS

| | | |
|---|---|---|
| EP | 1748489 | 1/2007 |
| EP | 2133918 | 12/2009 |
| EP | 2207204 | 7/2010 |
| JP | 2004-363193 | 12/2004 |
| JP | 2005-223681 | 8/2005 |
| JP | 2006-032681 | 2/2006 |
| JP | 2006-093517 | 4/2006 |
| JP | 2007-088732 | 4/2007 |
| JP | 2008-048246 | 2/2008 |
| JP | 2008-099073 | 4/2008 |

OTHER PUBLICATIONS

European Communication pursuant to Article 94(3) EPC dated Mar. 15, 2012 in connection with counterpart EP application No. EP 10250118.6.

Japanese Office Action issued in connection with Japanese counterpart JP application No. JP 2009-027895 dated Jun. 25, 2013.

Japanese Office Action issued in connection with related Japanese Patent Application No. 2009-027895 dated Feb. 4, 2014.

* cited by examiner

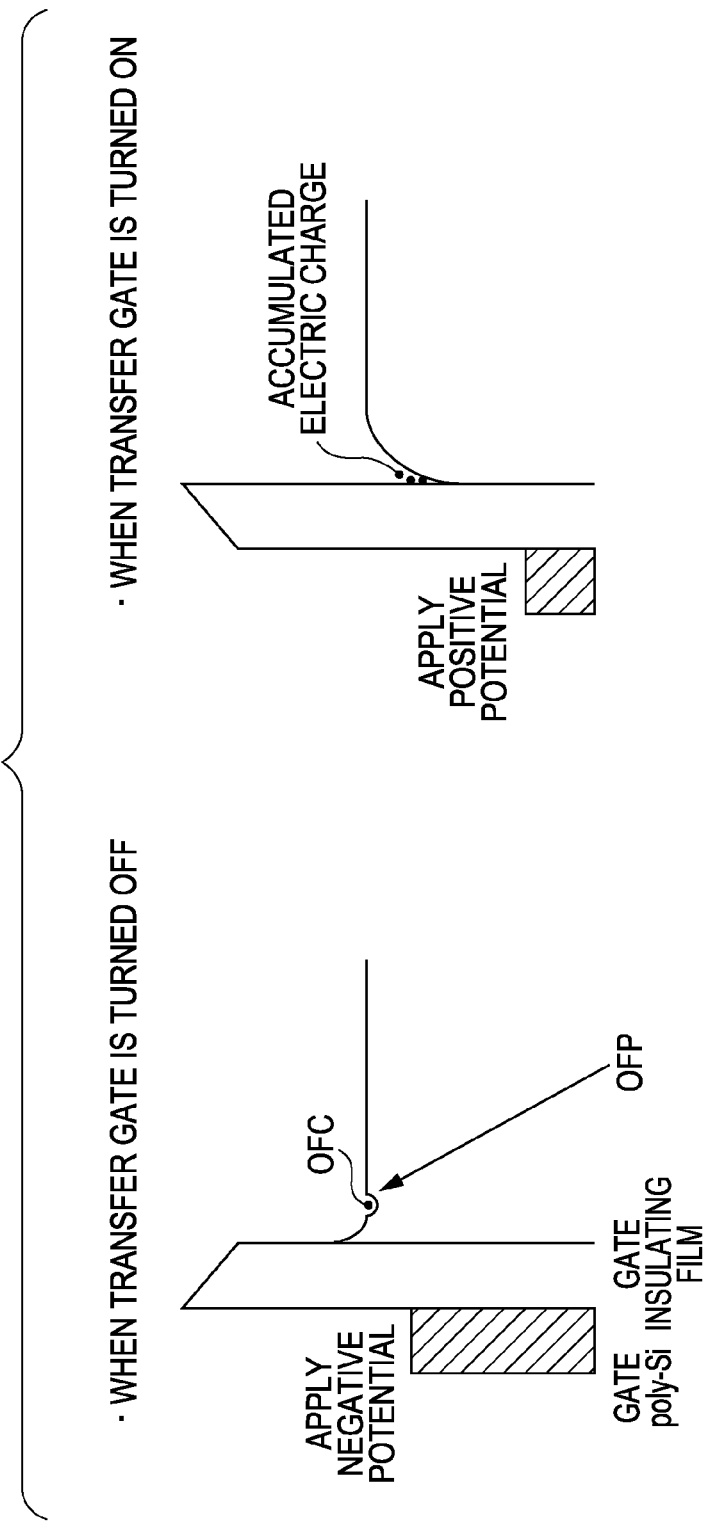

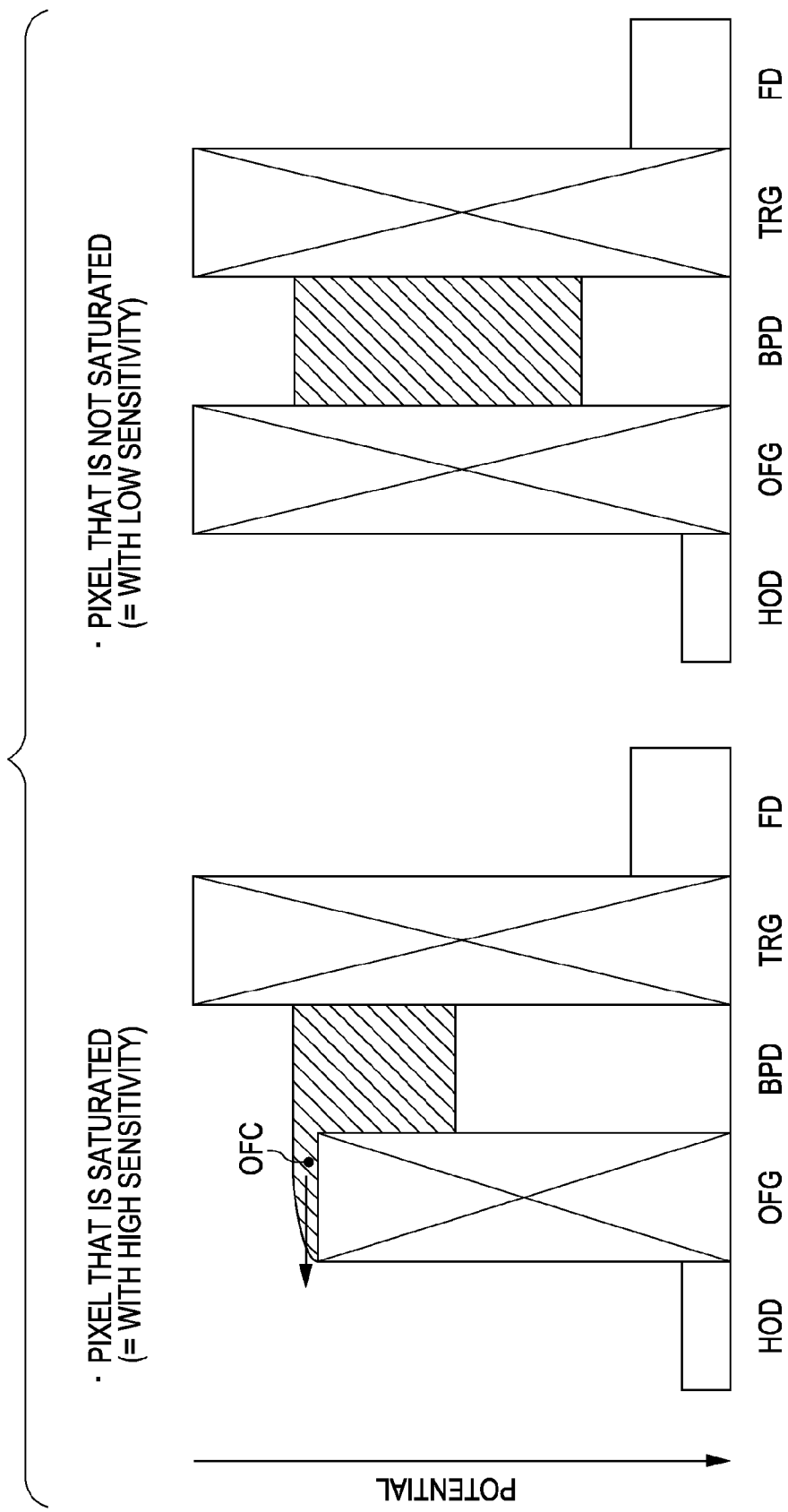

SOLID-STATE IMAGE PICKUP DEVICE AND CAMERA SYSTEM

RELATED APPLICATION DATA

This application is a continuation of U.S. patent application Ser. No. 12/698,326 filed Feb. 2, 2010, the entirety of which is incorporated herein by reference to the extent permitted by law. The present application claims the benefit of priority to Japanese Patent Application No. JP 2009-027895 filed on Feb. 9, 2009 in the Japan Patent Office, the entirety of which is incorporated by reference herein to the extent permitted by law.

BACKGROUND OF THE INVENTION

1. Field of the Invention

The present invention relates to a solid-state image pickup device represented by a complementary metal-oxide semiconductor (CMOS) image sensor, and to a camera system.

2. Description of the Related Art

In recent years, CMOS image sensors have been attracting attention as solid-state image pickup devices (images sensors), in place of charge-coupled devices (CCDs).

This is because CMOS image sensors overcome the following problems.

That is, the problems include that a dedicated manufacturing process is necessary for fabricating CCD pixels, a plurality of power supply voltages are necessary for the operation thereof, and it is necessary to cause a plurality of peripheral integrated circuits (ICs) to be operated in a combined manner.

CMOS image sensors overcome these various problems of CCDs, such as that the system becomes very complicated.

CMOS image sensors can be manufactured using a manufacturing process similar to the process of manufacturing general CMOS ICs. Also, a CMOS image sensor can be driven by a single power supply. Furthermore, an analog circuit and a logic circuit using CMOS processes can be mixed in a single chip.

Accordingly, the number of peripheral ICs in a CMOS image sensor can be reduced. That is, CMOS sensors have multiple great advantages.

An output circuit of a CCD is generally a 1-channel (ch) output using a floating diffusion (FD) amplifier with a floating diffusion layer.

In contrast, a CMOS image sensor has an FD amplifier in each pixel and generally uses a column-parallel output scheme that selects a row from an array of pixels and simultaneously reads and outputs signals from the row in a column direction.

Because it is difficult to obtain sufficient drive power using the FD amplifiers arranged in the pixels, the data rate is necessary to be dropped. In this sense, parallel processing is regarded to be advantageous.

Such CMOS image sensors have been widely used as image pickup devices in image capturing apparatuses such as digital cameras, camcorders, monitoring cameras, and in-vehicle cameras.

The technique of adding output signals from multiple photodiodes (PDs) with different sensitivities and outputting the sum signal as an output signal from a pixel is effective as a method of realizing a CMOS image sensor with a high dynamic range. In particular, buried photodiodes (BPDs) are widely used as PDs. Since there is a surface level due to defects such as dangling bonds on the surface of a substrate on which PDs are formed, a great amount of electric charge (dark current) is generated owing to the thermal energy. As a result, it becomes difficult to read a correct signal. In the case of BPDs, electric charge accumulating portions of PDs are buried in the substrate. In this way, the amount of dark current introduced into the signal is reduced.

The sensitivity of a PD can be changed by changing the exposure time or by providing a neutral density (ND) filter.

This method has the following advantages:

A higher dynamic range than that achieved by simply using a large pixel can be achieved; and Although the output relative to the amount of incident light is nonlinear, the output can be easily changed back to be linear. When a color image is obtained, it is easy to perform color processing.

SUMMARY OF THE INVENTION

When there is overflowing electric charge from a BPD with a high sensitivity, the overflowing electric charge flows into a BPD with a low sensitivity. It thus becomes difficult to output correct data.

In contrast, when the exposure time is reduced so that no overflowing electric charge will be generated and a BPD with a high sensitivity will not be saturated, the dynamic range is not extended.

The present invention provides a solid-state image pickup device and a camera system that can absorb overflowing electric charge from a photoelectric conversion element with a high sensitivity, that can realize a correct data output, and that can realize a high dynamic range.

A solid-state image pickup device according to an embodiment of the present invention includes a pixel unit in which a plurality of photoelectric conversion elements having different sensitivities are arranged; and a pixel reading unit configured to read and add output signals from the plurality of photoelectric conversion elements in the pixel unit, and to obtain an output signal seemingly from one pixel. The pixel unit includes an absorbing unit configured to absorb overflowing electric charge from a photoelectric conversion element with a high sensitivity.

A camera system according to an embodiment of the present invention includes a solid-state image pickup device; an optical system configured to form an image of a photographic subject on the solid-state image pickup device; and a signal processing circuit configured to process an output image signal of the solid-state image pickup device. The solid-state image pickup device includes a pixel unit in which a plurality of photoelectric conversion elements having different sensitivities are arranged, and a pixel reading unit configured to read and add output signals from the plurality of photoelectric conversion elements in the pixel unit, and to obtain an output signal seemingly from one pixel. The pixel unit includes an absorbing unit configured to absorb overflowing electric charge from a photoelectric conversion element with a high sensitivity.

According to an embodiment of the present invention, overflowing electric charge from a photoelectric conversion element with a high sensitivity can be absolved; a correct data output can be realized; and a high dynamic range can be realized.

BRIEF DESCRIPTION OF THE DRAWINGS

FIG. 10 includes timing charts, according to the first embodiment, illustrating an example of the case where the sensitivity of each BPD is changed by providing a neutral density (ND) filter or the like;

FIG. 13 includes diagrams describing the overflow path of the second embodiment and illustrating the potential along line XIII-XIII illustrated in FIG. 11B;

FIG. 18 includes timing charts, according to a fourth embodiment, illustrating an example of the case where the sensitivity of each BPD is changed by providing an ND filter or the like;

FIG. 29 includes diagrams describing the overflow path of the seventh embodiment and illustrating the potential of electrons along line XXVIIIB-XXVIIIB illustrated in FIG. 28A;

DESCRIPTION OF THE PREFERRED EMBODIMENTS

Embodiments of the present invention will be described with reference to the drawings.

The description will be given in the following order:
1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment

1. First Embodiment

Figure 1:
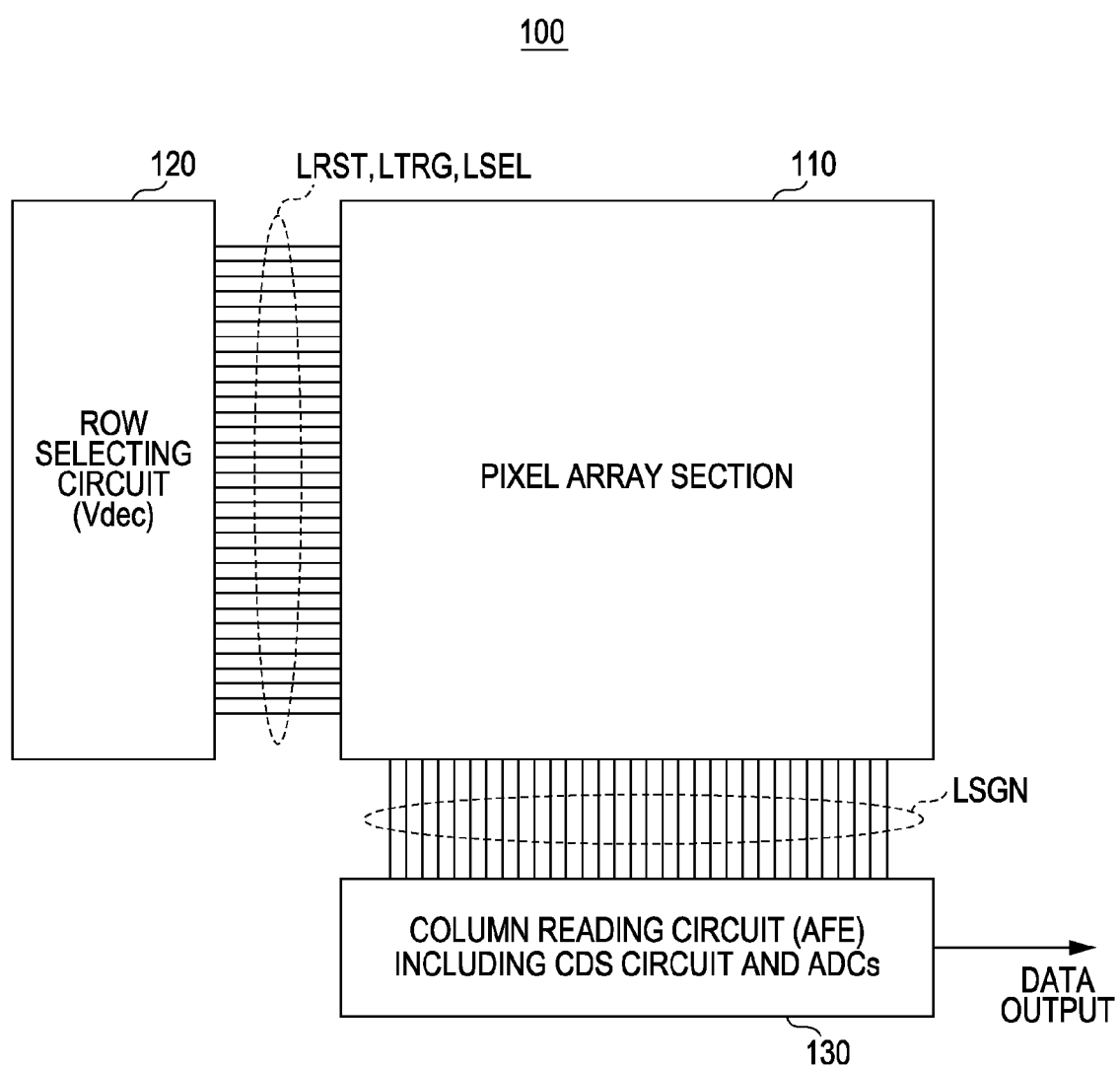
FIG. 1 is a diagram illustrating a structure example of a CMOS image sensor (solid-state image pickup device) according to an embodiment of the present invention.

FIG. 1 is a diagram illustrating a structure example of a CMOS image sensor (solid-state image pickup device) according to an embodiment of the present invention.

A CMOS image sensor 100 includes a pixel array section 110, a row selecting circuit (Vdec) 120 serving as a pixel driving unit, and a column reading circuit (AFE) 130.

The pixel array section 110 includes multiple pixel circuits 110A which are arranged in two dimensions (matrix) of M rows×N columns.

A resetting control line LRST, a transfer control line LTRG, and a selection control line LSEL arranged in the pixel array section 110 are grouped as a set for each row of the pixel arrangement.

The resetting control line LRST, the transfer control line LTRG, and the selection control line LSEL are driven by the row selecting circuit 120.

The row selecting circuit 120 controls the operation of pixels arranged on an arbitrary row in the pixel array section 110. The row selecting circuit 120 controls the pixels through the control lines LSEL, LRST, and LTRG.

Figure 2:
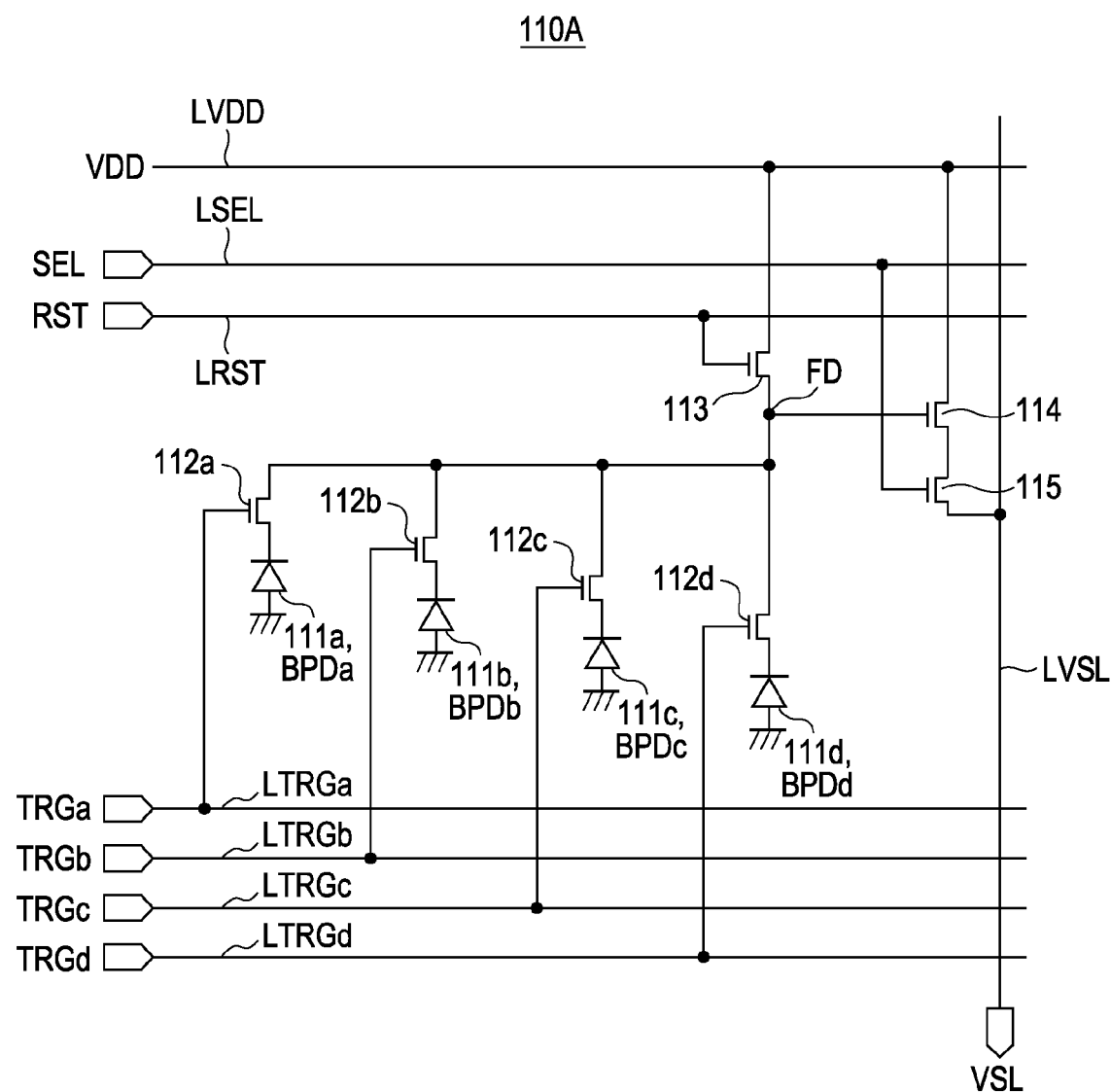
FIG. 2 is a diagram illustrating an example of a pixel circuit of the CMOS image sensor according to the present embodiment.

FIG. 2 is a diagram illustrating an example of a pixel circuit of the CMOS image sensor according to the present embodiment.

The pixel circuit 110A includes four BPDs 111a to 111d for performing photoelectric conversion.

The pixel circuit 110A includes transfer transistors (TGs) 112a to 112d which are individually provided for the BPDs 111a to 111d. The pixel circuit 110A also includes a reset transistor 113, an amplifying transistor 114, and a selection transistor 115 as active elements.

The pixel circuit 110A is formed as a sharing pixel circuit in which the four BPDs 111a to 111d share the reset transistor 113, the amplifying transistor 114, and the selection transistor 115.

When the pixel circuits 110A are arranged in two dimensions of M rows×N columns, M control lines LRST, M control lines LSEL, and 4M control lines LTR are provided.

The BPDs 111a to 111d perform photoelectric conversion of converting incident light into electric charge (electrons in this case) whose amount is in accordance with the amount of the incident light.

The BPDs 111a to 111d are connected to a floating diffusion FD via the transfer transistors 112a to 112d, respectively.

The transfer control lines LTRGa to LTRGd are connected to the gates of the transfer transistors 112a to 112d, respectively.

The transfer transistors 112a to 112d transfer electrons obtained by photoelectric conversion performed by the BPDs 111a to 111d in accordance with the potentials of the transfer control lines LTRGa to LTRGd to the floating diffusion FD.

The reset transistor 113 is connected between a power supply line LVDD and the floating diffusion FD.

The reset transistor 113 resets the potential of the floating diffusion FD in accordance with a potential applied to the reset control line LRST to the potential VDD of the power supply line LVDD.

The gate of the amplifying transistor 114 is connected to the floating diffusion FD.

The amplifying transistor 114 is connected via the selection transistor 115 to a signal line LVSL.

When the selection transistor 115 is turned on in accordance with the selection control line LSEL, the amplifying transistor 114 outputs a signal in accordance with the potential of the floating diffusion FD to the signal line LVSL.

A voltage output from each pixel is output through the signal line LVSL to the column reading circuit 130.

The column reading circuit 130 converts an analog signal output to the signal line LVSL into a digital signal and outputs the digital signal.

Hereinafter, the case where electric charge accumulated in a BPD includes electrons will be described. However, an embodiment of the present invention is also applicable to the case where the electric charge includes holes. In that case, it is only necessary to switch a P-type semiconductor and an N-type semiconductor.

Figure 3:
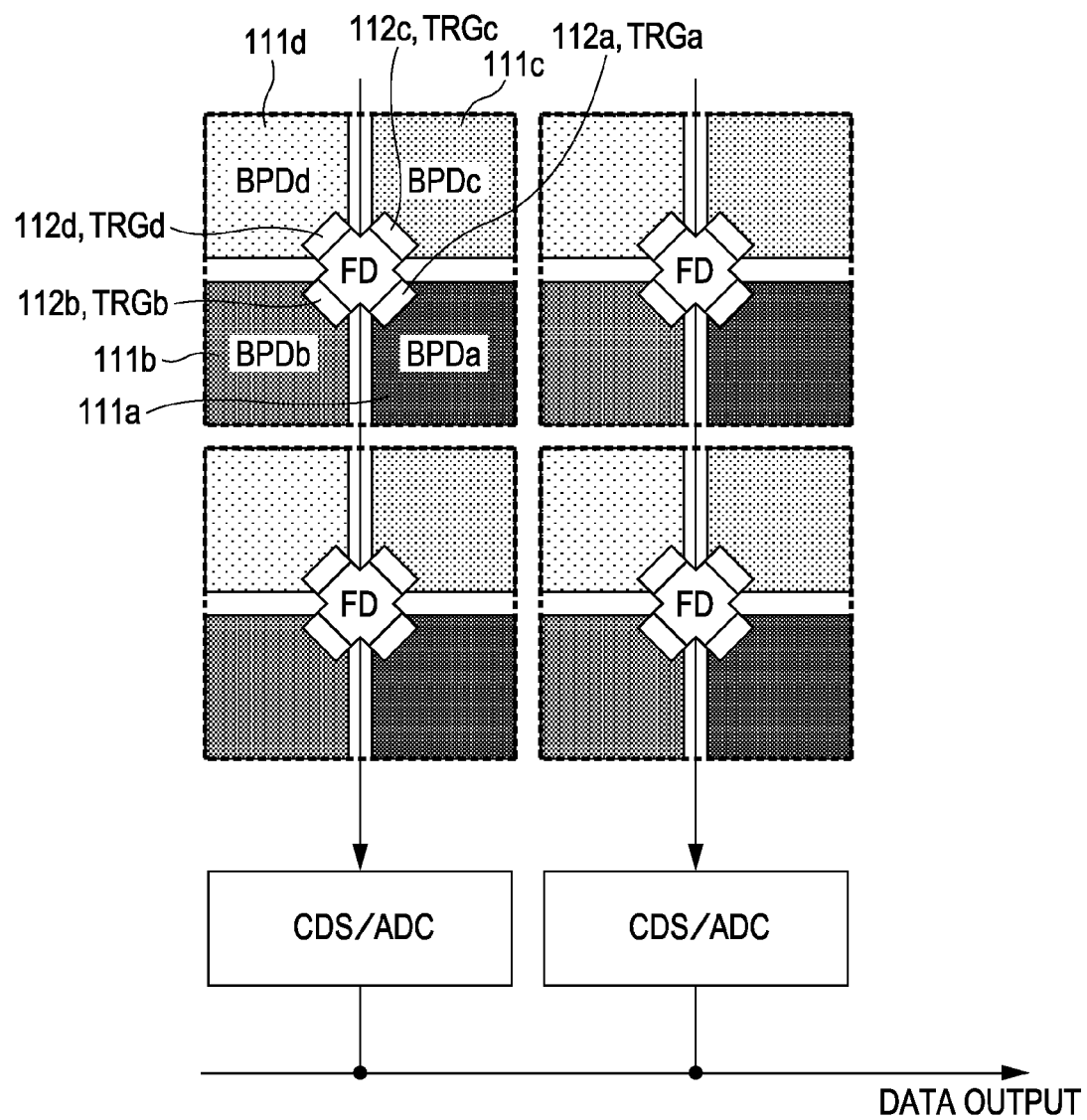
FIG. 3 is a diagram illustrating an arrangement example of the pixel circuit according to a first embodiment.

FIG. 3 is a diagram illustrating an arrangement example of the pixel circuit according to the present embodiment.

In the example in FIG. 3, the BPDs 111a to 111d are arranged in a square of 2×2 in each pixel. The floating diffusion FD is arranged in the center of the four BPDs 111a to 111d.

The column reading circuit 130 includes an analog-to-digital converter (ADC) provided in each column.

The BPDs 111a to 111d have different sensitivities a to d. The sensitivities of the BPDs 111a to 111d can be changed, for example, by providing ND filters and changing the amount of incident light, or by changing the exposure time.

Signals detected by the BPDs 111a to 111d are added by an ADC in each column, and the sum signal is output.

Figure 4:
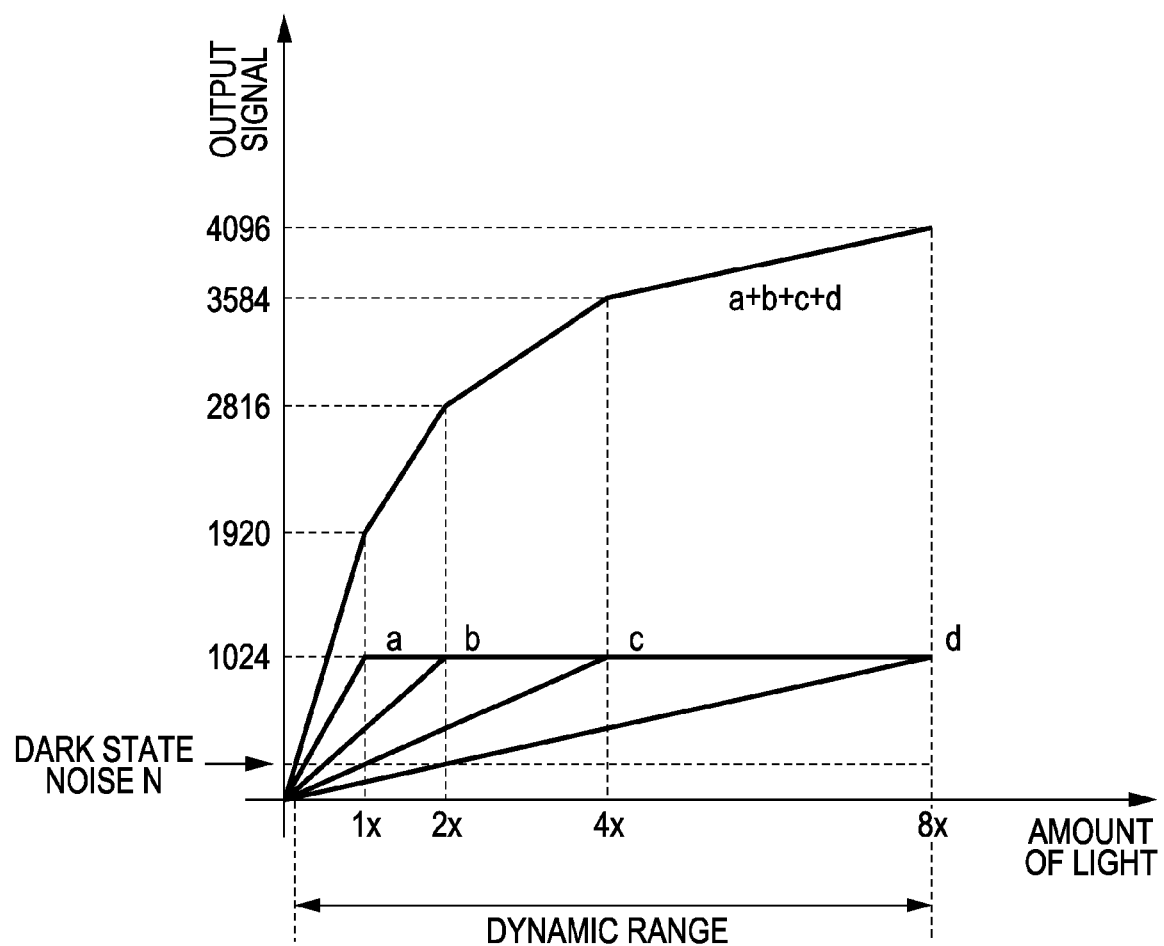
FIG. 4 is a graph illustrating an example of an output from each pixel.

FIG. 4 is a graph illustrating an example of an output from each pixel.

In FIG. 4, the amount of incident light is plotted in abscissa, and an output signal is plotted in ordinate.

FIG. 4 illustrates the case where the resolution of an ADC at the time of reading signals from the BPDs 111a to 111d is 10 bits, and the sensitivity ratio a:b:c:d of the BPDs 111a to 111d is a:b:c:d=8:4:2:1.

The dynamic range of the sensor is determined by the maximum value and the minimum value of the amount of light that can be read.

According to the structure of the first embodiment, while the minimum value of the amount of light that can be read remains substantially unchanged, the maximum value is increased by eight times. Accordingly, the dynamic range can be extended.

However, the method of adding signals detected by the BPDs 111a to 111d with different sensitivities has the problem that a BPD with a high sensitivity becomes saturated as the amount of light increases, leading to the generation of overflowing electric charge.

Figure 5:
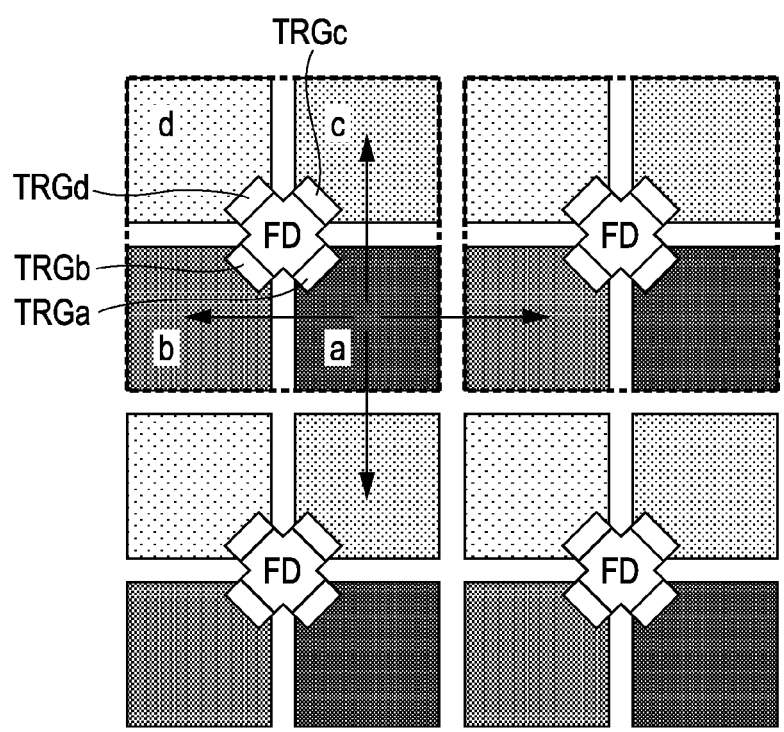
FIG. 5 is a diagram illustrating the generation of overflowing electric charge.

For example, in FIG. 4, when the amount of light is within the range of 1× to 2×, as illustrated in FIG. 5, overflowing electric charge is generated in the BPD 111a.

Unless the overflowing electric charge is absorbed, the overflowing electric charge flows into peripheral pixels. It thus becomes difficult to obtain a correct output value.

In contrast, in the first embodiment, an overflow path OFP is provided as an absorbing unit from each of the BPDs 111 to the floating diffusion FD, and overflowing electric charge generated in each of the BPDs 111 is discharged to the floating diffusion FD.

An absorbing unit is formed by using an overflow path that absorbs overflowing electric charge in each of the BPDs 111.

Figure 6A:
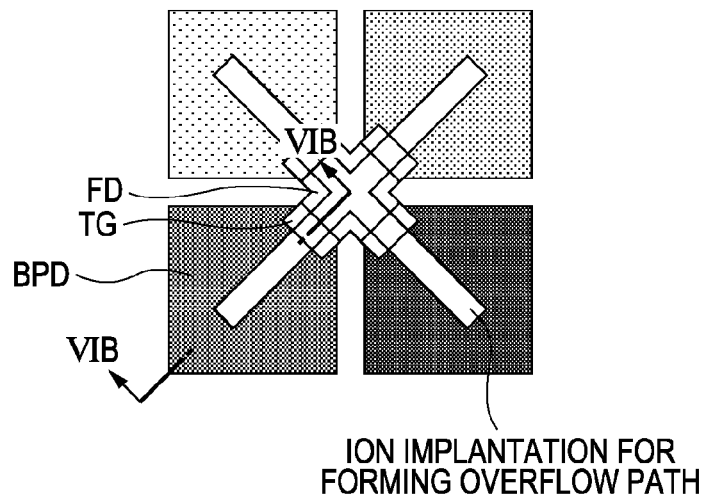
FIGS. 6A and 6B are diagrams describing an overflow path of the first embodiment.
Figure 6B:
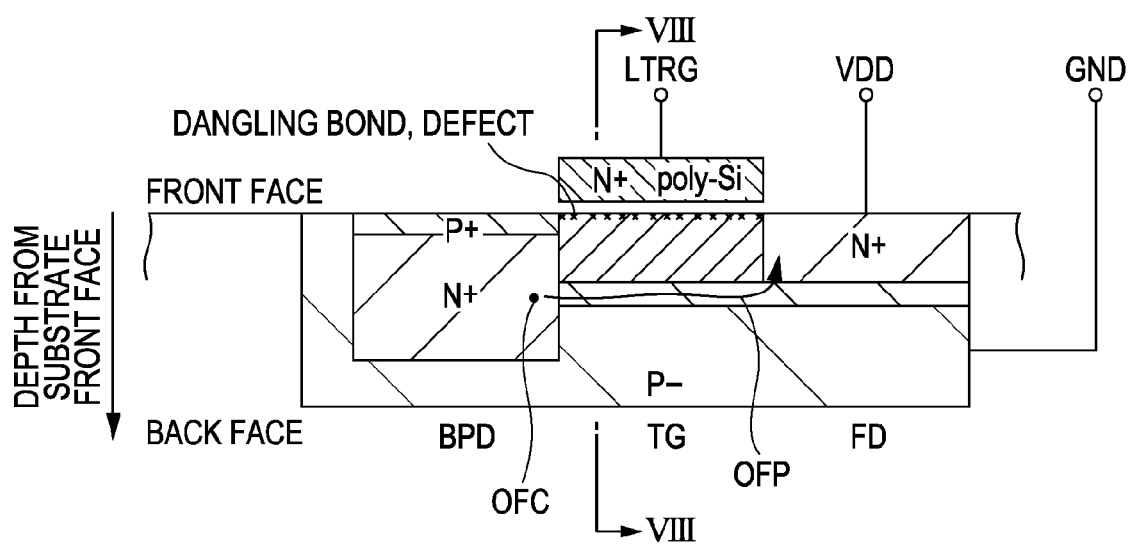

FIGS. 6A and 6B are diagrams describing the overflow path of the first embodiment. FIG. 6A is a top view of a pixel according to the first embodiment, and FIG. 6B is a sectional view of the BPD 111, the transfer transistor (TG) 112, and the floating diffusion FD taken along line VIB-VIB illustrated in FIG. 6A.

Figure 7:
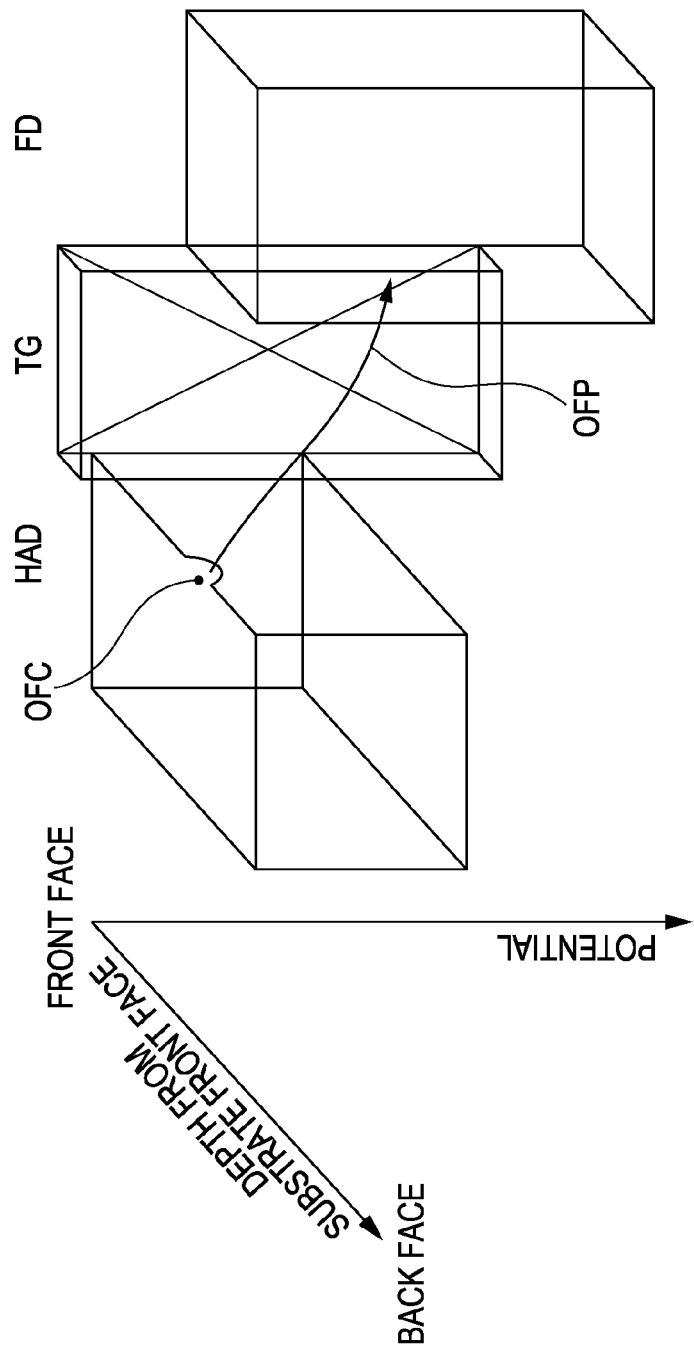
FIG. 7 is a diagram describing the overflow path of the first embodiment and illustrating the potential of electrons along line VIB-VIB illustrated in FIG. 6A.

Also, FIG. 7 is a diagram describing the overflow path of the first embodiment and illustrating the potential of electrons along line VIB-VIB illustrated in FIG. 6A.

Figure 8:
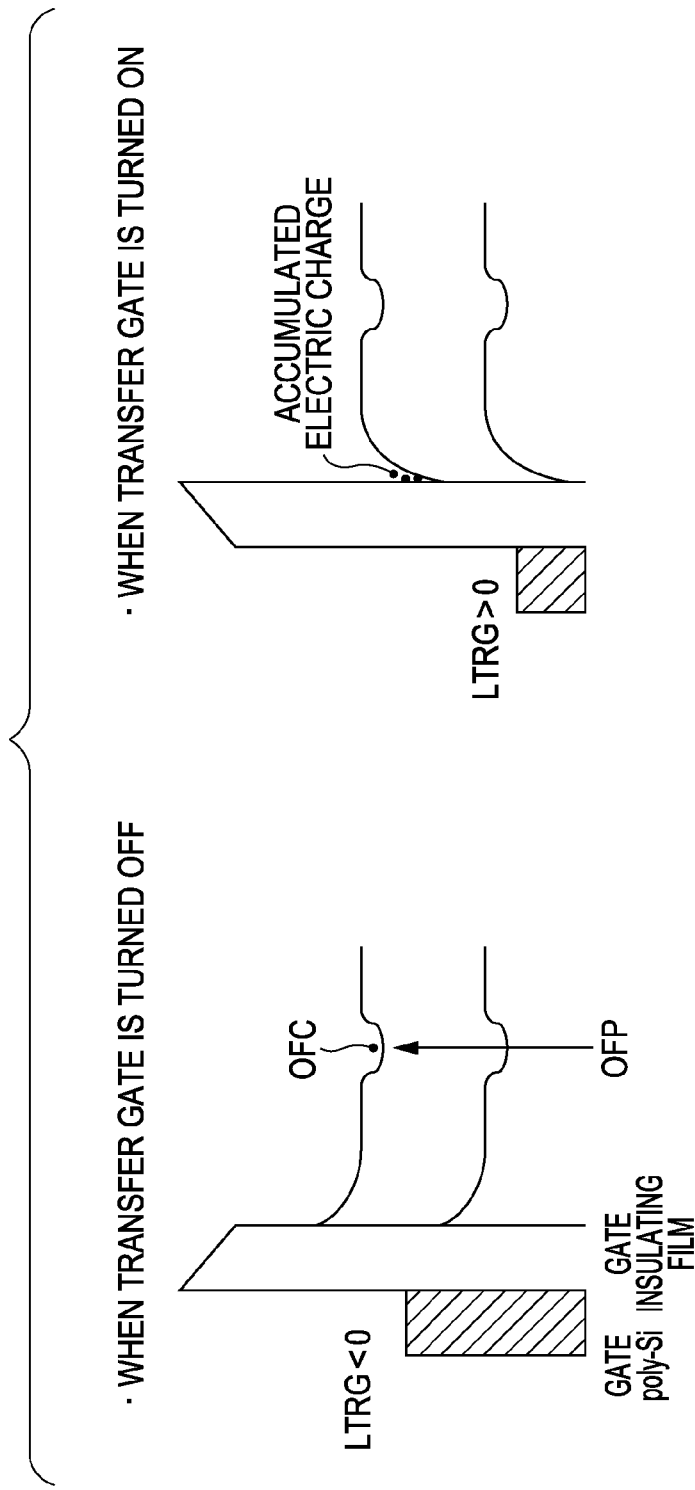
FIG. 8 includes diagrams describing the overflow path of the first embodiment and illustrating the potential along line VIII-VIII illustrated in FIG. 6B.

FIG. 8 includes diagrams describing the overflow path of the first embodiment and illustrating the potential along line VIII-VIII illustrated in FIG. 6B.

FIG. 8 illustrates the potential below a transfer gate of the transfer transistor (TG) 112.

In the first embodiment, overflowing electric charge generated in the BPD 111 is discharged through the overflow path provided in the transfer transistor (TG) 112 to the floating diffusion FD.

A positive potential (e.g., power supply voltage) is supplied to the floating diffusion FD. The overflowing electric charge is discharged from the floating diffusion FD.

By providing the overflow path in the transfer transistor (TG) 112, the overflowing electric charge can be discharged without increasing the area.

When the gate poly-Si of the gate (transfer gate) of the transfer transistor (TG) 112 is doped with N-type, it is desirable to apply a negative potential (e.g., −1 V) to the transfer control line LTRG in an off state, or to dope the gate poly-Si of the transfer gate with P-type and to apply 0 V.

Since there is a surface level due to a defect such as a dangling bond at the transistor interface, a large amount of electric charge is generated by the thermal energy.

Thus, if there is an overflow path at the transistor interface, electric charge generated from the surface level flows into the BPD 111, and it becomes difficult to read correct data.

In contrast, when a negative voltage is applied to the transfer gate (or when the gate poly-Si is made P-type), as illustrated in FIG. 8, the potential at the transistor interface of the transfer gate becomes higher, and holes are accumulated.

Accordingly, the generation of electric charge at the transistor interface can be suppressed.

However, if the potential at the transistor interface is increased, it becomes difficult to provide an overflow path at the transistor interface.

Therefore, the overflow path of the first embodiment is provided at a position deeper than the transistor interface (Si—SiO$_2$ interface) of the transfer transistor (TG) 112, as illustrated in FIG. 6(B) and FIG. 8.

For example, when the depth of the BPD 111 is 2 to 4 μm and the depth of the floating diffusion FD is about 0.4 μm, the overflow path OFP is provided at the depth of about 0.2 to 0.5 μm.

In this way, introduction of noise due to the surface level can be prevented.

Also, since the overflow path OFP is sufficiently distant from a channel (e.g., 200 to 300 nm), there is no effect on the transfer of electric charge. The overflow path OFP can be formed by injecting a very small amount of impurity that makes silicon an N-type semiconductor, such as As.

FIG. 7 is a diagram illustrating the potential of electrons in the VIB-VIB section in the horizontal direction and the depth direction.

The overflow path of the first embodiment is formed such that the potential of electrons locally becomes lower, compared with peripheral sections.

In this way, if the electric charge accumulated in the BPD 111 exceeds a certain amount, the exceeding amount is discharged through the overflow path to the floating diffusion FD.

Figure 9:
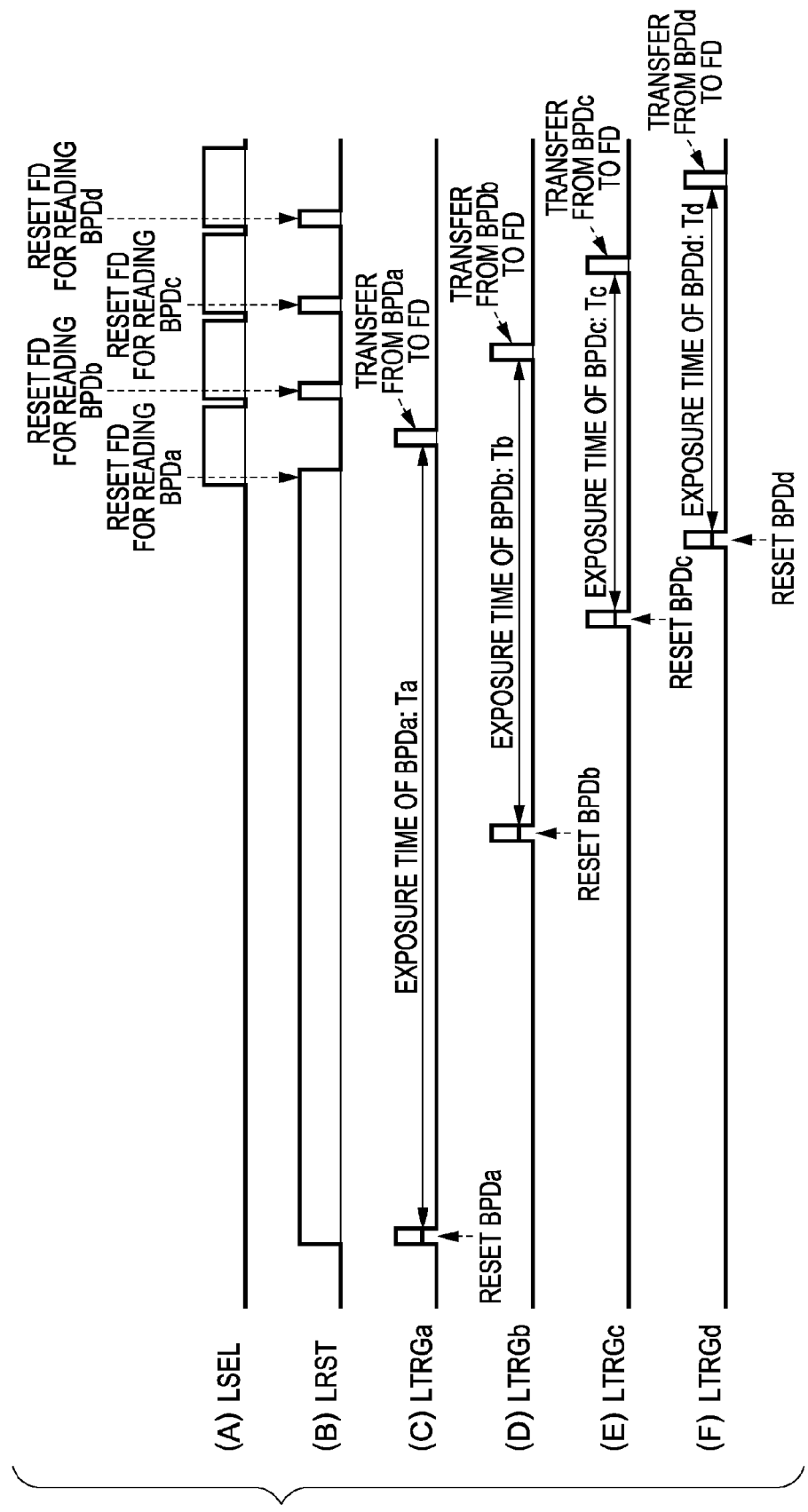
FIG. 9 includes timing charts, according to the first embodiment, illustrating an example of the case where the sensitivity of each BPD is changed in accordance with an exposure time.
Figure 10:
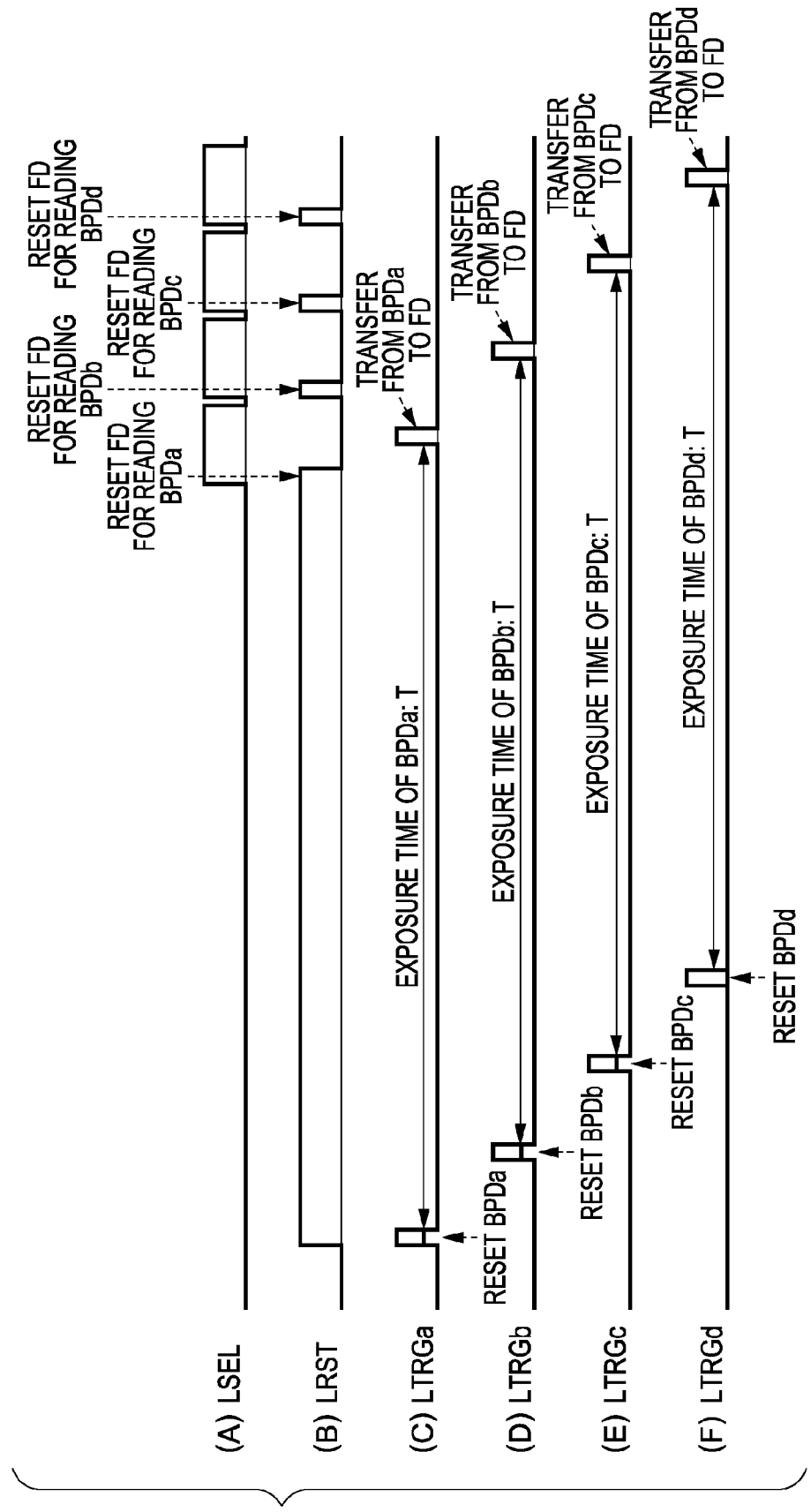

Parts (A) to (F) of FIGS. 9 and 10 are timing charts according to the first embodiment.

Parts (A) to (F) of FIG. 9 illustrate an example of the case where the sensitivities a to d of the BPDs 111a to 111d are changed in accordance with the exposure time.

The sensitivity ratio among the BPDs 111a to 111d is determined in accordance with the exposure time: a:b:c:d=Ta:Tb:Tc:Td.

In contrast, parts (A) to (F) of FIG. 10 illustrate an example of the case where the sensitivities a to d of the BPDs 111a to 111d are changed by providing, for example, ND filters.

In this case, the exposure times of the BPDs 111a to 111d are made equal as T.

During an exposure period, the resetting control line LRST is caused to be at a high level (H), thereby turning on the reset transistor 113. Accordingly, the power supply potential VDD is supplied to the floating diffusion FD.

When reading electric charge from the BPDs 111, it is necessary to turn off the reset transistor 113 and to separate the floating diffusion FD from the power supply line LVDD.

Thus, if reading is not performed in an appropriate order, overflowing electric charge OFC discharged through the overflow path OFP to the floating diffusion FD is introduced into the electric charge transferred from the BPDs 111 to the floating diffusion FD. Therefore, in the first embodiment, reading from the BPDs 111 is performed in the descending order of sensitivity.

For example, when the levels of the sensitivities satisfy the relationship a>b>c>d, signals are read from the BPDs 111a to 111d in the descending order of sensitivity: BPD 111a, BPD 111b, BPD 111c, and BPD 111d.

In this way, even when the overflowing electric charge OFC is introduced into the electric charge transferred from the BPDs 111, a correct output value can be obtained from the ADC.

For example, when the output value relative to the amount of light has the characteristics illustrated in FIG. 4, under the condition that the amount of light 2× to 4× is incident, overflowing electric charge OFC may be generated in the BPD 111a and the BPD 111b.

However, the BPD 111c and the BPD 111d are not saturated, and no overflowing electric charge is generated.

Under this condition, when electric charge is first read from the BPD 111a, the overflowing electric charge OFC from the BPD 111b is introduced into the floating diffusion FD. However, since the output of the BPD 111a is saturated, the value read from the ADC remains 1024, which is unchanged.

Next, when a signal is read from the BPD 111b, the electric charge has already been read from the BPD 111a, and the BPD 111a is not saturated. Thus, introduction of the overflowing electric charge OFC does not occur.

Similarly, when electric charge is read from the BPD 111c and from the BPD 111d, since there is no BPD 111 that is saturated, introduction of the overflowing electric chare OFC does not occur.

Thus, the output value from the ADC is not affected by the overflowing electric charge, and a correct output value can be obtained.

As described above, according to the first embodiment, the following advantages can be achieved in the CMOS image sensor whose dynamic range is extended by adding outputs from multiple BPDs with different sensitivities.

According to the first embodiment, even under the condition that a BPD with a high sensitivity is saturated, a correct output value can be obtained by discharging overflowing electric charge from the BPD to the power supply.

By using the transfer transistors 112 and the floating diffusion FD as the overflow path OFP, the overflowing electric charge can be appropriately processed without increasing the area.

By separating the overflow path OFP from the transistor interface, introduction of noise due to the surface level can be prevented.

By reading signals from the BPDs in descending order of sensitivity, the overflowing electric charge is prevented from being introduced into the floating diffusion FD, and a correct output value can be obtained.

Although the case in which BPDs are used as elements for performing photoelectric conversion has been described above, the first embodiment is also effective in the case where PDs that are not buried are used.

The case in which signals from the BPDs are read by using the ADC and are added has been described. Alternatively, the method of processing the overflowing electric charge OFC by using the transfer transistors and the floating diffusion FD is also effective in the case where signals from the BPDs are simultaneously read to the floating diffusion FD and are added.

2. Second Embodiment

Next, a second embodiment of the present invention will be described.

The overall structure of a CMOS image sensor according to the second embodiment can be the structure illustrated in FIG. 1, as in the first embodiment.

The structure of a pixel circuit according to the second embodiment can be the structure illustrated in FIG. 2, as in the first embodiment.

The arrangement of the pixel circuit according to the second embodiment can be the arrangement illustrated in FIG. 3, as in the first embodiment.

The sensitivities a to d of the BPDs 111a to 111d according to the second embodiment are different, as in the first embodiment.

The output signal and the dynamic range of a pixel according to the second embodiment are the same as the first embodiment, as illustrated in FIG. 4.

Also in the second embodiment, overflowing electric charge is generated from the BPD 111 with a high sensitivity, as illustrated in FIG. 5.

Figure 11A:
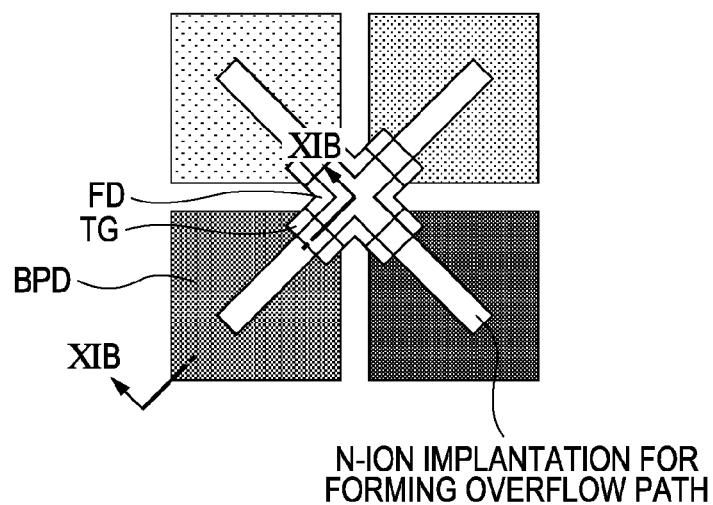
FIGS. 11A and 11B are diagrams describing an overflow path of a second embodiment.
Figure 11B:
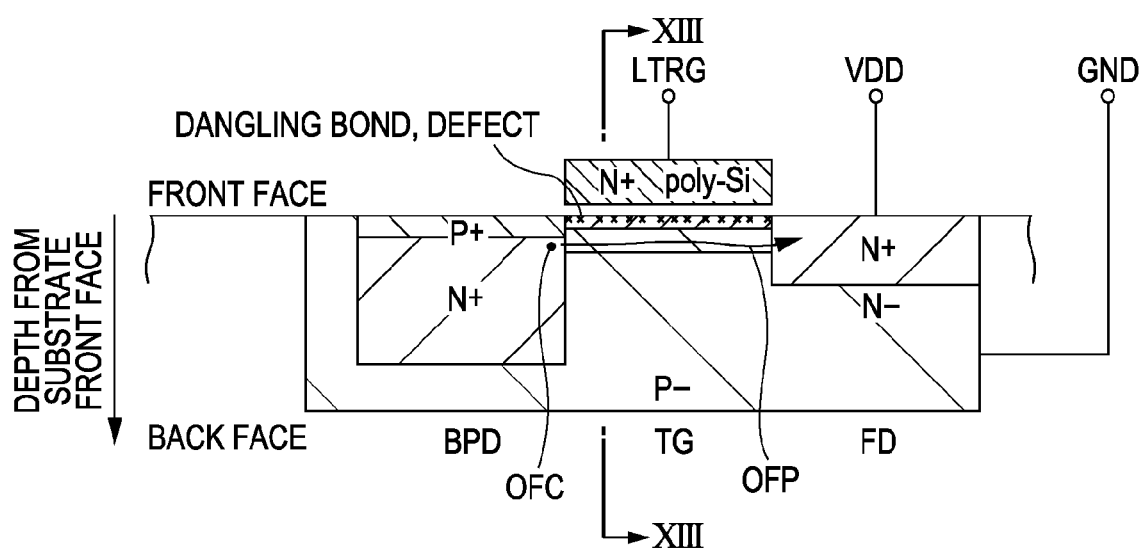

FIGS. 11A and 11B are diagrams describing an overflow path of the second embodiment.

FIG. 11A is a top view of a pixel according to the second embodiment, and FIG. 11B is a sectional view of the BPD 111, the transfer transistor (TG) 112, and the floating diffusion FD taken along line XIB-XIB illustrated in FIG. 11A.

Figure 12:
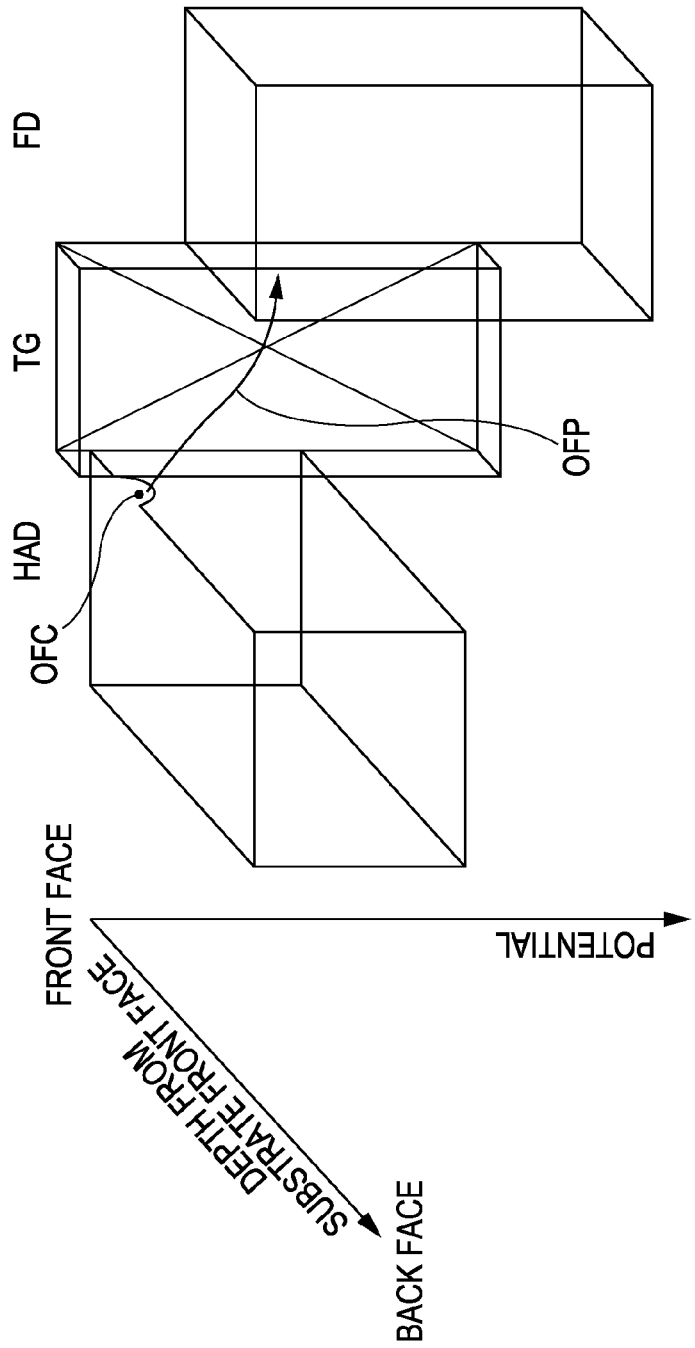
FIG. 12 is a diagram describing the overflow path of the second embodiment and illustrating the potential of electrons along line XIB-XIB illustrated in FIG. 11A.

Also, FIG. 12 is a diagram describing the overflow path of the second embodiment and illustrating the potential of electrons along line XIB-XIB illustrated in FIG. 11A.

FIG. 13 includes diagrams describing the overflow path of the second embodiment and illustrating the potential along line XIII-XIII illustrated in FIG. 11B.

FIG. 13 illustrates the potential below a transfer gate of the transfer transistor (TG) 112.

Also in the second embodiment, overflowing electric charge OFC generated in the BPD 111 is discharged through the overflow path OFP formed at the transfer gate which is the transfer transistor 112 to the floating diffusion FD.

A positive potential (e.g., power supply voltage) is supplied to the floating diffusion FD. The overflowing electric charge is discharged from the floating diffusion FD.

By providing the overflow path in the transfer transistor 112, the overflowing electric charge can be discharged without increasing the area.

Also in the second embodiment, as in the first embodiment, when the gate poly-Si of the transfer gate is doped with N-type, it is desirable to apply a negative potential (e.g., −1 V) to the transfer control line LTRG in an off state, or to dope the gate poly-Si of the transfer gate with P-type and to apply 0 V.

If the potential at the transistor interface is increased, it becomes difficult to provide an overflow path at the transistor interface.

Therefore, the overflow path OFP of the second embodiment is provided at a position a little deeper than the transistor interface (Si—SiO$_2$ interface) of the transfer transistor (TG) 112, as illustrated in FIG. 11(B).

For example, when the depth of the BPD 111 is 2 to 4 µm and the depth of the floating diffusion FD is about 0.4 µm, the overflow path OFP is provided at the depth of about 50 to 100 nm.

The depth may change according to process. Basically, a position a little deeper than the PD junction on the BPD surface is desirable.

In this way, introduction of noise due to the surface level can be prevented.

Also, the transfer efficiency at the time of turning on the transfer transistor 112 (transfer gate) and transferring the electric charge can be improved. The overflow path OFP can be formed by injecting a very small amount of impurity that makes silicon an N-type semiconductor, such as As.

FIG. 12 is a diagram illustrating the potential in the XIB-XIB section in the horizontal direction and the depth direction.

The overflow path of the second embodiment is formed such that the potential of electrons locally becomes lower, compared with peripheral sections.

In this way, if the electric charge accumulated in the BPD 111 exceeds a certain amount, the exceeding amount is discharged through the overflow path OFP to the floating diffusion FD.

Timing charts according to the second embodiment are the same as those in the first embodiment, as illustrated in parts (A) to (F) of FIGS. 9 and 10.

As described above, according to the second embodiment, the following advantages can be achieved in the CMOS image sensor whose dynamic range is extended by adding outputs from multiple BPDs with different sensitivities.

According to the second embodiment, even under the condition that a BPD with a high sensitivity is saturated, a correct output value can be obtained by discharging overflowing electric charge from the BPD to the power supply.

By using the transfer transistors 112 and the floating diffusion FD as the overflow path OFP, the overflowing electric charge OFC can be appropriately processed without increasing the area.

By separating the overflow path OFP from the transistor interface, introduction of noise due to the surface level can be prevented.

By reading signals from the BPDs in descending order of sensitivity, the overflowing electric charge OFC can be prevented from being introduced into the floating diffusion FD, and a correct output value can be obtained.

Although the case in which BPDs are used as elements for performing photoelectric conversion has been described above, the second embodiment is also effective in the case where PDs that are not buried are used.

The case in which signals from the BPDs are read by using the ADC and are added has been described.

Alternatively, the method of processing the overflowing electric charge OFC by using the transfer transistors (TG) 112 and the floating diffusion FD is also effective in the case where signals from the BPDs are simultaneously read to the floating diffusion FD and are added.

3. Third Embodiment

Next, a third embodiment of the present invention will be described.

The overall structure of a CMOS image sensor according to the third embodiment can be the structure illustrated in FIG. 1, as in the first embodiment.

The structure of a pixel circuit according to the third embodiment can be the structure illustrated in FIG. 2, as in the first embodiment.

The arrangement of the pixel circuit according to the third embodiment can be the arrangement illustrated in FIG. 3, as in the first embodiment.

The sensitivities a to d of the BPDs 111a to 111d according to the third embodiment are different, as in the first embodiment.

The output signal and the dynamic range of a pixel according to the third embodiment are the same as the first embodiment, as illustrated in FIG. 4.

Figure 14A:
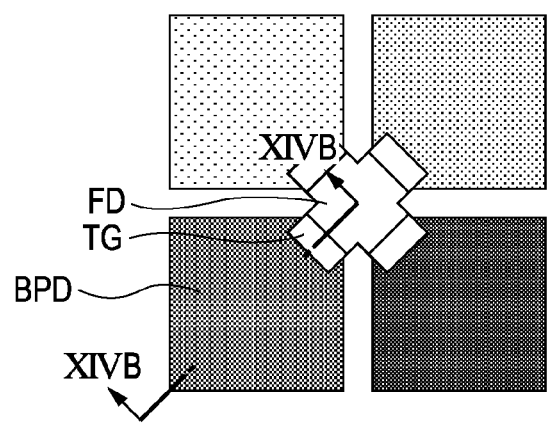
FIGS. 14A and 14B are diagrams describing an overflow path of a third embodiment.
Figure 14B:
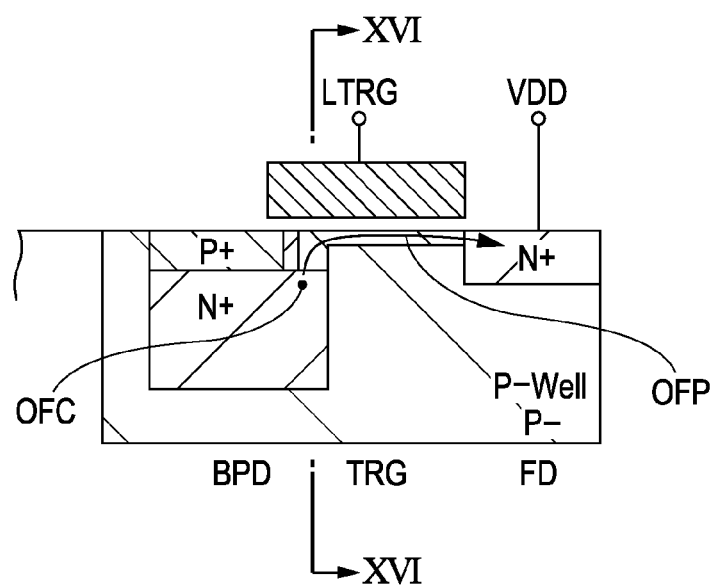

FIGS. 14A and 14B are diagrams describing an overflow path of the third embodiment.

FIG. 14A is a top view of a pixel according to the third embodiment, and FIG. 14B is a sectional view of the BPD 111, the transfer transistor (TG) 112, and the floating diffusion FD taken along line XIVB-XIVB illustrated in FIG. 14A.

Figure 15:
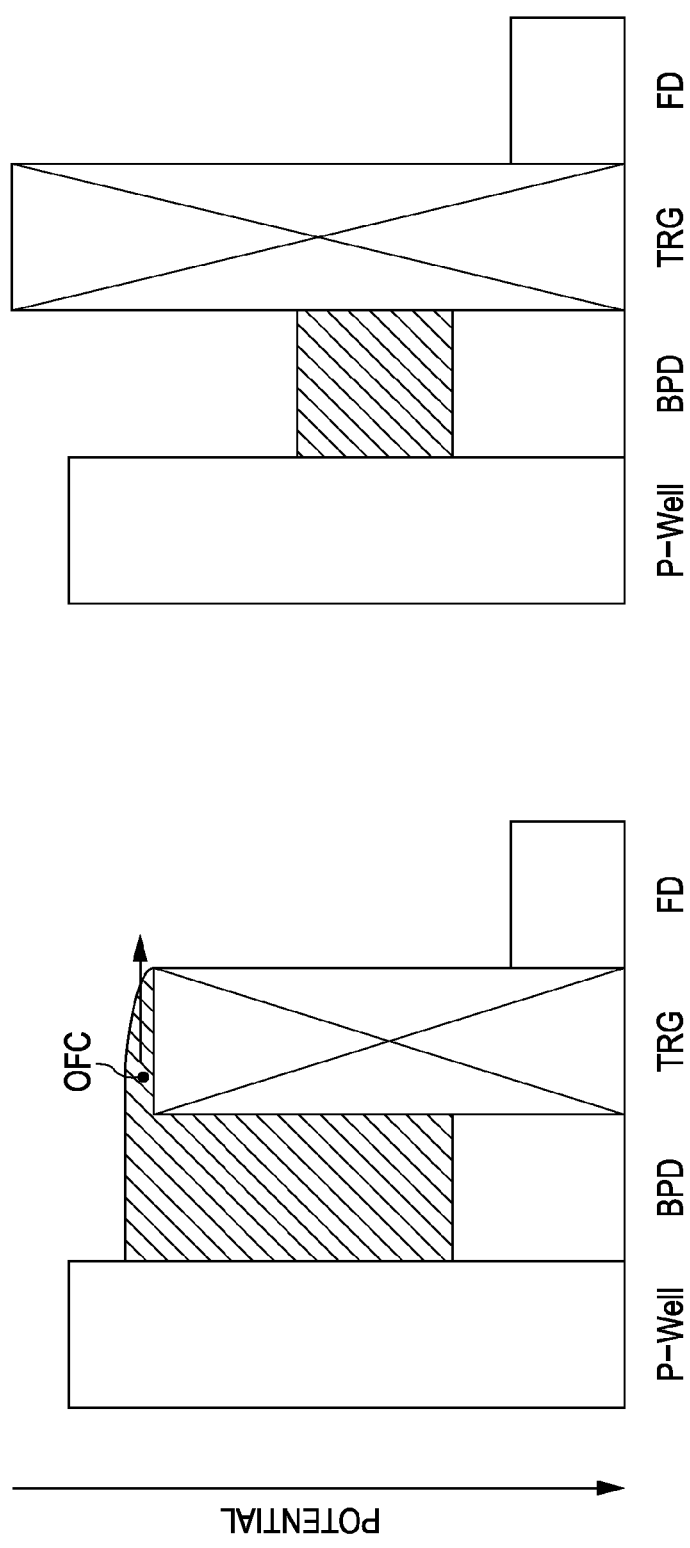
FIG. 15 includes diagrams describing the overflow path of the third embodiment and illustrating the potential of electrons along line XIVB-XIVB illustrated in FIG. 14A.

Also, FIG. 15 includes diagrams describing the overflow path of the third embodiment and illustrating the potential of electrons along line XIVB-XIVB illustrated in FIG. 14A.

Figure 16:
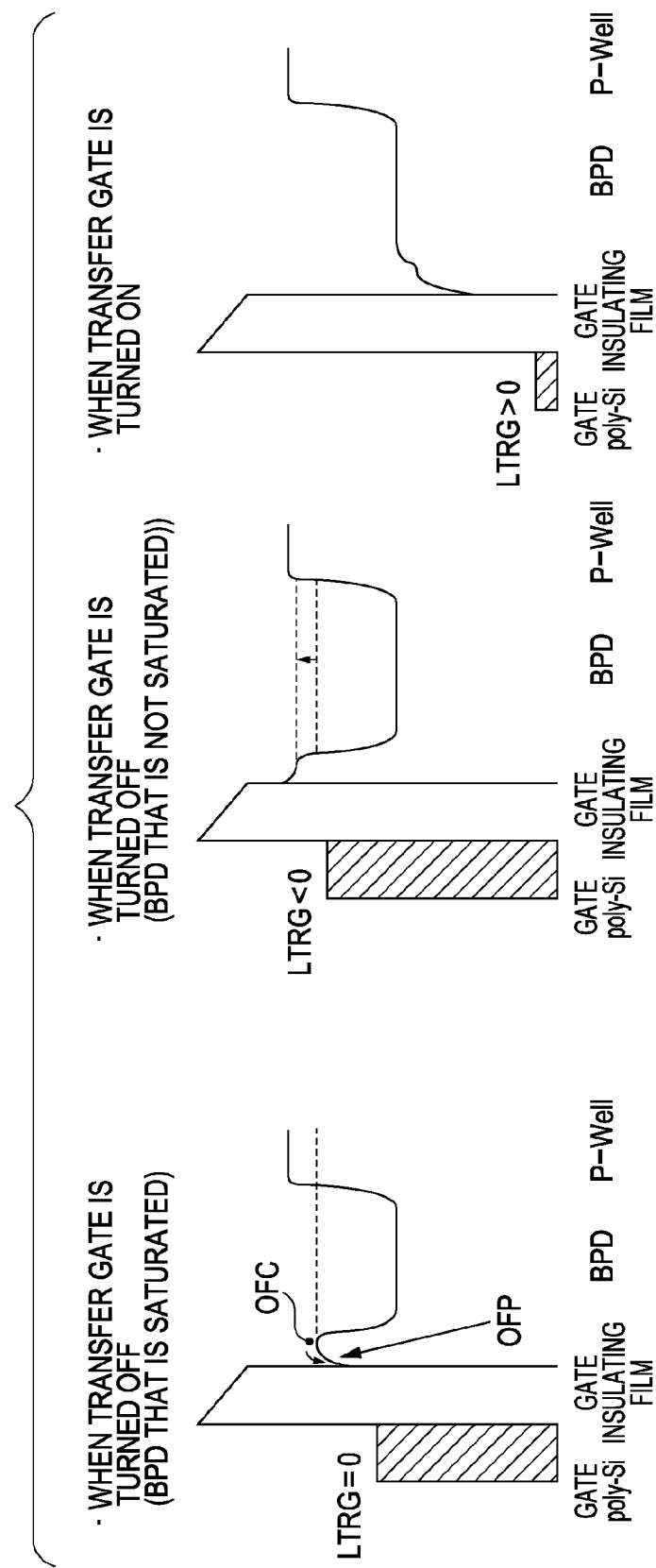
FIG. 16 includes diagrams describing the overflow path of the third embodiment and illustrating the potential along line XVI-XVI illustrated in FIG. 14B.

FIG. 16 includes diagrams describing the overflow path of the third embodiment and illustrating the potential along line XVI-XVI illustrated in FIG. 14B.

FIG. 16 illustrates the potential below a transfer gate of the transfer transistor (TG) 112.

In the third embodiment, overflowing electric charge OFC is discharged through the transistor interface of the transfer transistor 112, which serves as the overflow path OFP, to the floating diffusion floating diffusion FD, as illustrated in FIGS. 14A to 16.

Specifically, the potential of a channel of the transfer transistor 112 is reduced.

In this way, if the electric charge accumulated in the BPD 111 exceeds a certain amount, the exceeding amount is discharged through the channel of the transfer transistor (TG) 112 to the floating diffusion FD.

However, when the transistor interface serves as the overflow path OFP, electric charge generated at the surface level is introduced into the BPD 111.

It is know that the generation of electric charge at the surface level can be greatly suppressed by terminating the defect level of the transistor interface by using hydrogen H or deuterium D.

However, when the terminating process is insufficient or when the terminated H or D drops off, the defect level is left. As a result, noise which has occurred at the surface level is introduced into some of the BPDs 111.

Therefore, in the third embodiment, as illustrated in FIG. 14(B) and FIG. 16, the BPD 111 is extended underneath the transfer gate, and the overflow path OFP is provided in the vertical direction from the BPD 111 to the channel.

Furthermore, the potential between the BPD 111 and the transistor interface is made the highest in the overflow path OFP.

By providing a barrier between the transistor interface and the BPD 111 as above, electric charge generated at the transistor interface is suppressed from being introduced into the BPD 111.

The barrier between the BPD 111 and the transistor interface is provided near the transistor interface. When a positive potential is applied to the transfer control line LTRG, the potential of the barrier greatly changes. Accordingly, no failure occurs at the time of transfer. Also, regarding the BPD 111 which is not saturated, by applying a negative potential to the transfer control line LTRG, the generation of electric charge at the transistor interface can be prevented.

In the third embodiment, as illustrated in FIGS. 14A to 16, the overflow path OFP is turned on by applying a positive potential or a ground potential (e.g., 0 V) to the gate of the transfer transistor (TG) 112 connected to the saturated BPD 111 with a high sensitivity. The generation of electrons from the surface level is suppressed by applying a negative potential (e.g., −1 V) to the gate of the transfer transistor 112 connected to the BPD 111 with a low sensitivity.

In this way, although noise from the surface level may be introduced into the BPD 111 with a high sensitivity, noise is hardly introduced into the BPD 111 with a low sensitivity.

Therefore, whether noise from the surface level is introduced into the BPD 111 with a high sensitivity can be determined by comparing an output of the BPD 111 with a high sensitivity with an output of the BPD 111 with a low sensitivity.

For example, it is assumed that the sensitivity ratio between the BPD 111a and the BPD 111b is a:b=2:1, and signals read from the BPD 111a and the BPD 111b are denoted by Sa and Sb. When incident light that enters the BPD 111a is the same as that enters the BPD 111b, the relationship between Sa and Sb is as follows, taking noise into consideration:

$$2(Sb-Sb^{1/2}-1)<Sa<2(Sb+Sb^{1/2}+1) \quad (1)$$

Therefore, when $Sa>2(Sb+Sb^{1/2}+1)$, it is determined that the electric charge from the surface level is introduced. Hence, the output value can be corrected.

Actually, because the amount of incident light that enters each BPD 111 is not completely equal, and the amount of light changes because a photographic subject or the image pickup device itself moves, the relationship between Sa and Sb may be different from expression (1). It is therefore desirable to provide some margin.

For example, when about 20% margin is provided, if the output value Sa becomes $Sa>2.4(Sb+Sb^{1/2}+1)$ with respect to the output value Sb, the output value Sa is corrected.

Figure 17:
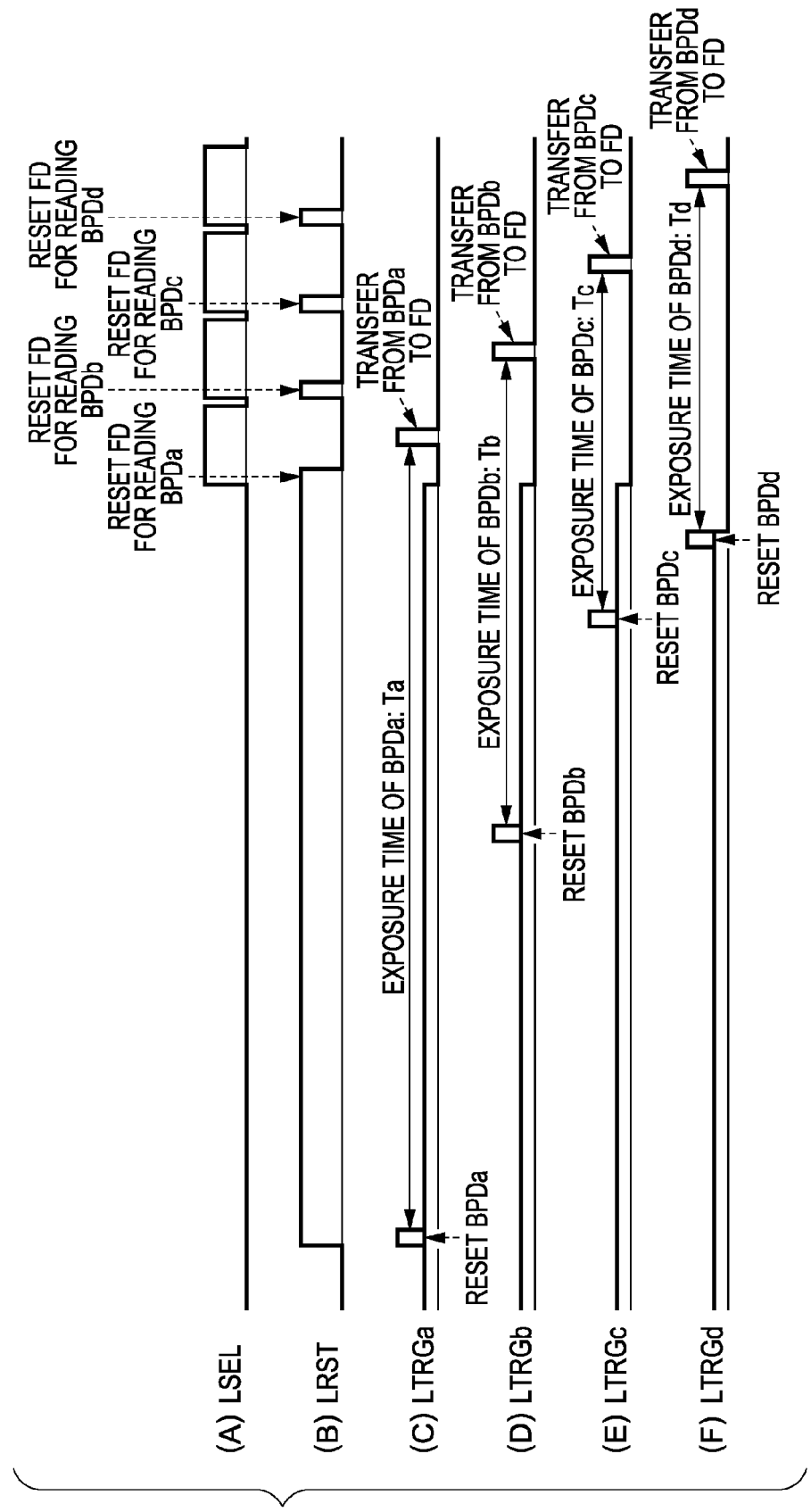
FIG. 17 includes timing charts, according to the third embodiment, illustrating an example of the case where the sensitivity of each BPD is changed in accordance with an exposure time.
Figure 18:
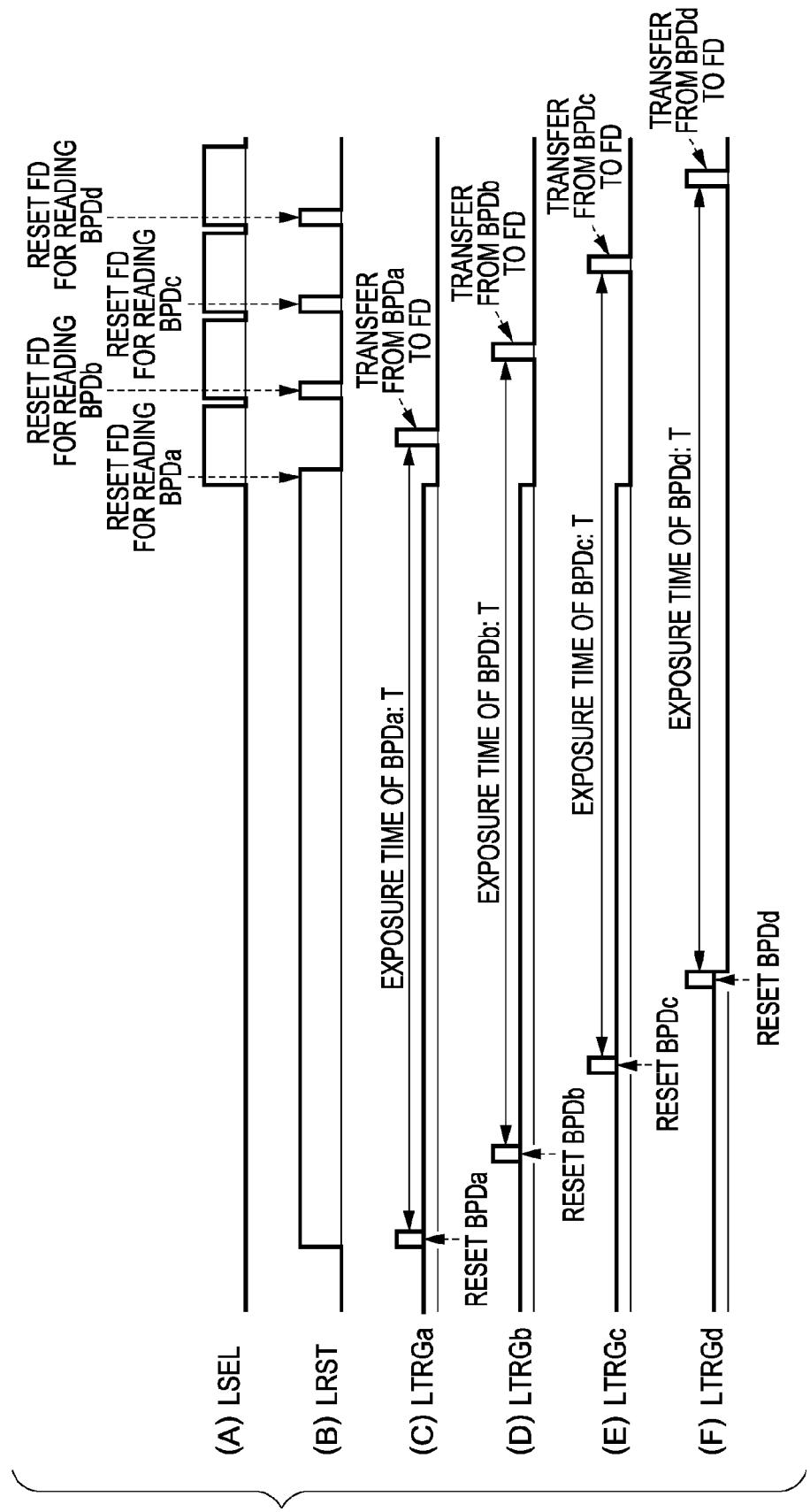

Parts (A) to (F) of FIG. 17 and parts (A) to (F) of FIG. 18 are exemplary timing charts according to the third embodiment.

Parts (A) to (F) of FIG. 17 illustrate an example of the case where the sensitivities a to d of the BPDs 111a to 111d are changed in accordance with the exposure time.

The sensitivity ratio among the BPDs 111a to 111d is determined in accordance with the exposure time: a:b:c:d=Ta:Tb:Tc:Td.

In contrast, parts (A) to (F) of FIG. 18 illustrate an example of the case where the sensitivities a to d of the BPDs 111a to 111d are changed by providing, for example, ND filters.

The exposure times of the BPDs 111a to 111d are made equal as T.

In FIGS. 17 and 18, the case where the levels of the sensitivities satisfy the relationship a>b>c>d is illustrated.

In the BPD 111a, BPD 111b, and BPD 111c, the gate voltages of the transfer transistors 112 are increased after the resetting so as to turn on the overflow path OFP.

In contrast, in the BPD 111d, the voltage applied to the gate of the transfer transistor (TG) 112 is maintained at a low level even after the resetting, and noise from the surface level is prevented from being introduced into the BPD 111d.

In reading periods, voltages applied to the gates of all the transfer transistors 112a to 112d (TRGa to TRGd) are maintained at a low level, thereby turning off the overflow path OFP.

In this way, overflowing electric charge is prevented from being introduced into the floating diffusion FD in the reading periods.

In exposure periods, the resetting control line LRST is maintained at a high level (H), thereby turning on the reset transistor 113. Accordingly, the power supply voltage VDD is supplied to the floating diffusion FD.

In the examples of FIGS. 17 and 18, the overflow path OFP of the individual transfer transistors 112a to 112d is turned on even before resetting the individual BPDs 111a to 111d. Accordingly, the overflowing electric charge OFC is discharged to the floating diffusion FD.

This prevents the overflowing electric charge OFC from being introduced into the BPDs 111a to 111d when the BPDs 111a to 111d are saturated before being reset.

For example, when the BPD 111b is saturated, unless the overflowing electric charge generated in the BPD 111b is absorbed, the overflowing electric charge is introduced into the BPD 111a in a period from the resetting of the BPD 111a to the resetting of the BPD 111b.

As illustrated in FIGS. 17 and 18, the overflowing electric charge OFC can be prevented from being introduced into the BPDs 111a to 111d by turning on the overflow path OFP in periods prior to resetting the individual BPDs 111a to 111d.

As described above, according to the third embodiment, the following advantages can be achieved in the CMOS image sensor whose dynamic range is extended by adding outputs from multiple BPDs with different sensitivities.

According to the third embodiment, even under the condition that a BPD with a high sensitivity is saturated, a correct output value can be obtained by discharging overflowing electric charge from the BPD to the power supply.

By using the transfer transistors 112 and the floating diffusion FD as the overflow path OFP, the overflowing electric charge OFC can be appropriately processed without increasing the area.

By applying a low voltage to the gate of the transfer transistor 112 connected to a BPD with a low sensitivity, noise from the surface level of the transistor interface can be prevented from being introduced into the BPD, and a correct output value can be obtained.

Even when noise from the surface level is introduced into a BPD with a high sensitivity, a correct output can be obtained by performing a correction using the output value read from a BPD with a low sensitivity.

4. Fourth Embodiment

Next, a fourth embodiment of the present invention will be described.

The overall structure of a CMOS image sensor according to the fourth embodiment can be the structure illustrated in FIG. 1, as in the first to third embodiments.

The structure of a pixel circuit according to the fourth embodiment can be the structure illustrated in FIG. 2, as in the first to third embodiments.

The sensitivities a to d of the BPDs 111a to 111d according to the fourth embodiment are different, as in the first embodiment.

The output signal and the dynamic range of a pixel according to the fourth embodiment are the same as the first embodiment, as illustrated in FIG. 4.

Also in the fourth embodiment, overflowing electric charge is generated from the BPD 111 with a high sensitivity, as illustrated in FIG. 5.

An overflow path of the fourth embodiment is the same as that in the third embodiment. As illustrated in FIGS. 14A to 16, overflowing electric charge is discharged through the transistor interface of the transfer transistor 112, which serves as the overflow path, to the floating diffusion floating diffusion FD.

Also, the point that an output from the BPD 111 with a high sensitivity can be corrected by using an output of the BPD 111 with a low sensitivity is the same as the third embodiment.

In a pixel circuit according to the fourth embodiment, the BPD 111 with a high sensitively and the BPD 111 with a low sensitivity are arranged next to each other.

Figure 19:
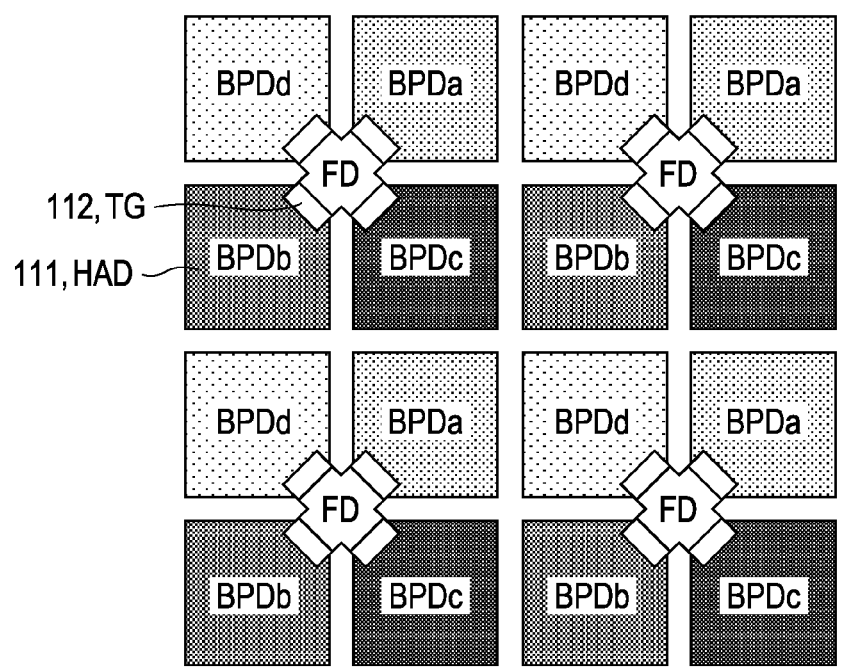
FIG. 19 is a diagram illustrating an arrangement example of a pixel circuit according to the fourth embodiment in the case where four BPDs with different sensitivities are shared by one floating diffusion (FD)

FIG. 19 is a diagram illustrating an arrangement example of the pixel circuit according to the fourth embodiment in the case where the four BPDs 111a to 111d with different sensitivities are shared by one floating diffusion (FD).

FIG. 19 illustrates the case where the levels of the sensitivities of the BPDs 111a to 111d satisfy the relationship a>b>c>d.

In this case, the BPD 111a with the highest sensitivity is vertically and horizontally adjacent only to the BPD 111c and the BPD 111d, but not to the BPD 111a and the BPD 111b.

With such a structure, most of the overflowing electric charge generated in the BPD 111a or the BPD 111b flows into the adjacent BPD 111c or BPD 111d, and hardly any of the overflowing electric charge flows into the BPD 111a and the BPD 111b.

Figure 20:
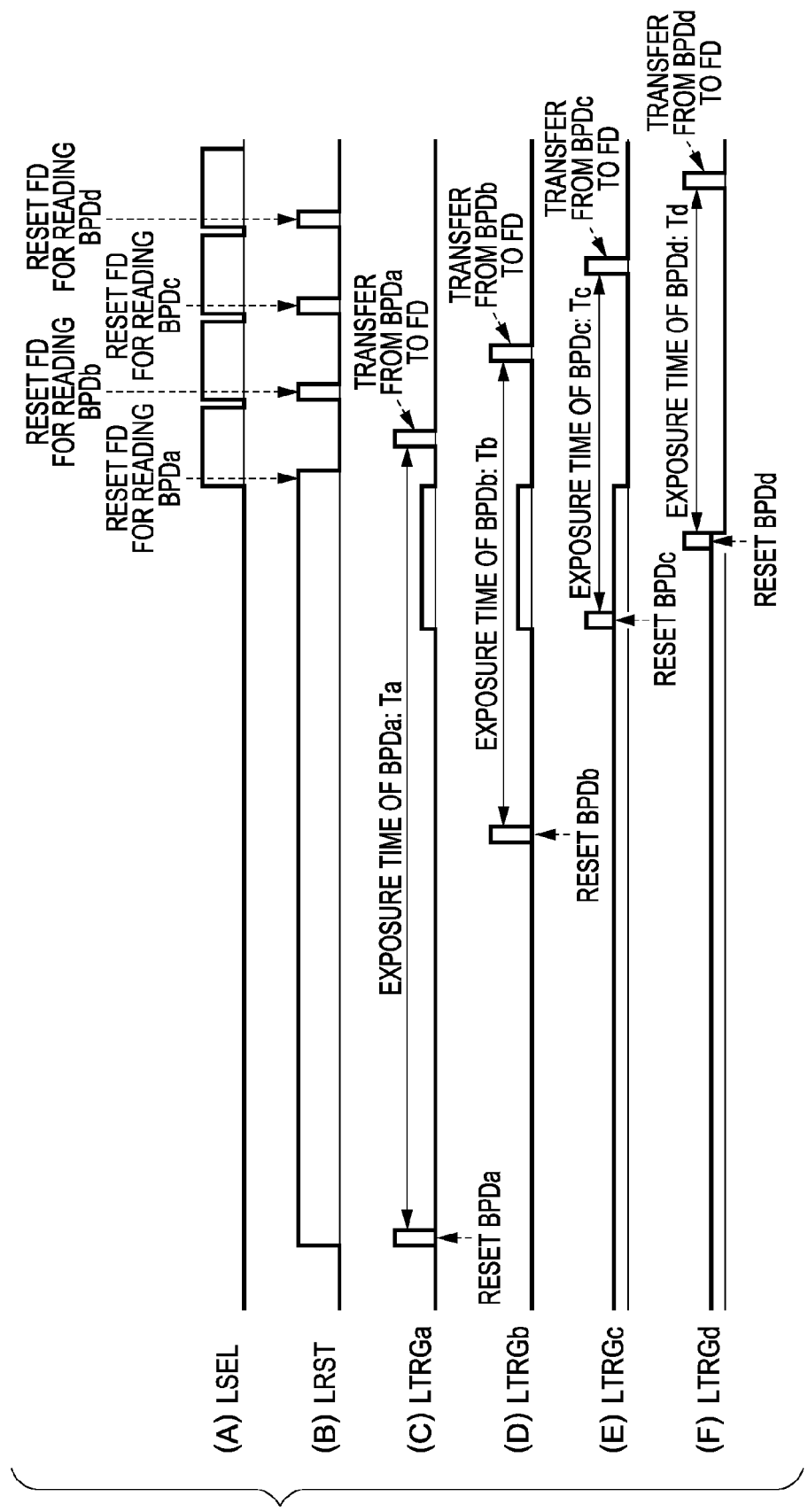
FIG. 20 includes exemplary timing charts according to the fourth embodiment.

Parts (A) to (F) of FIG. 20 are exemplary timing charts according to the fourth embodiment.

In the fourth embodiment, the sensitivities a to d of the BPDs 111a to 111d are changed in accordance with the exposure time. The sensitivity ratio among the BPDs 111a to 111d is determined in accordance with the exposure time: a:b:c:d=Ta:Tb:Tc:Td.

In the BPD 111a, BPD 111b, and BPD 111c, the gate voltages of the transfer transistors 112 are increased after the resetting so as to turn on the overflow path OFP.

In a period from when the BPD 111a is reset to when the BPD 111c is reset, a negative potential (e.g., −1 V) is applied to the transfer gate of the BPD 111a.

In a period from when the BPD 111b is reset to when the BPD 111c is reset, a negative potential is applied to the transfer gate of the BPD 111b.

In this way, the period in which electric charge is generated from the transistor interface is reduced, and introduction of the electric charge into the BPDs 111 is suppressed.

Since the overflow path is closed in the periods in which the negative voltage is applied to the transfer gates of the BPD 111a and the BPD 111b, the overflowing electric charge flows into the adjacent BPD 111c and BPD 111d.

Note that the periods in which the negative potential is applied to the transfer gates of the BPD 111a and the BPD 111b are prior to the resetting of the BPD 111c and the BPD 111d.

If the overflowing electric charge flows into the BPD 111c and the BPD 111d, all of the overflowing electric charge is discharged to the power supply by the resetting, and the electric charge is not introduced into a signal to be obtained.

At the same time, a positive potential or a ground potential (0 V) is applied to the transfer gates of the BPD 111c and the BPD 111d in periods prior to the resetting of the BPD 111c and the BPD 111d. Thus, the overflow path is opened.

Accordingly, even when the BPD 111c and the BPD 111d are saturated, the overflowing electric charge is discharged through the floating diffusion FD to the power supply.

As described above, according to the arrangement and a driving method of the pixel circuit of the fourth embodiment, in addition to the advantages of the third embodiment, the amount of electric charge generated at the transistor interface and introduced into a BPD with a high sensitivity is reduced, thereby obtaining a correct output value.

5. Fifth Embodiment

Next, a fifth embodiment of the present invention will be described.

The overall structure of a CMOS image sensor according to the fifth embodiment can be the structure illustrated in FIG. 1, as in the first embodiment.

The structure of a pixel circuit according to the fifth embodiment can be the structure illustrated in FIG. 2, as in the first embodiment.

The arrangement of the pixel circuit according to the fifth embodiment can be the arrangement illustrated in FIG. 3, as in the first embodiment.

The sensitivities a to d of the BPDs 111a to 111d according to the fifth embodiment are different, as in the first embodiment.

The output signal and the dynamic range of a pixel according to the fifth embodiment are the same as the first embodiment, as illustrated in FIG. 4.

In the fifth embodiment, overflowing electric charge generated in the BPD 111 is absorbed by a vertical overflow drain (VOD).

Figure 21A:
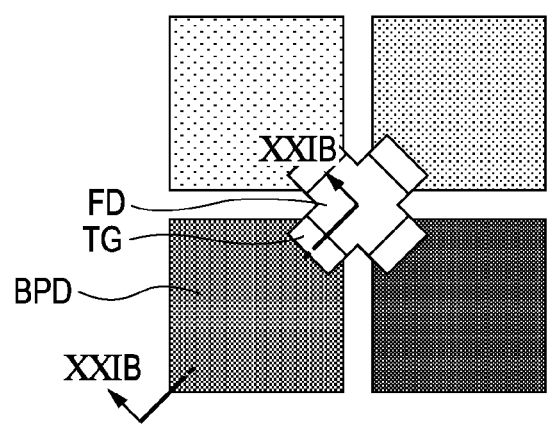
FIGS. 21A and 21B are diagrams describing an overflow path of a fifth embodiment.
Figure 21B:
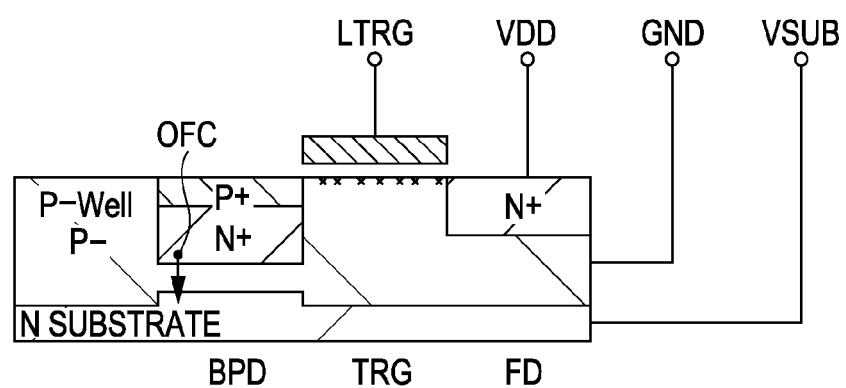

FIGS. 21A and 21B are diagrams describing an overflow path of the fifth embodiment.

FIG. 21A is a top view of a pixel according to the fifth embodiment, and FIG. 21B is a sectional view of the BPD 111, the transfer transistor (TG) 112, and the floating diffusion FD taken along line XXIB-XXIB illustrated in FIG. 21A.

Figure 22:
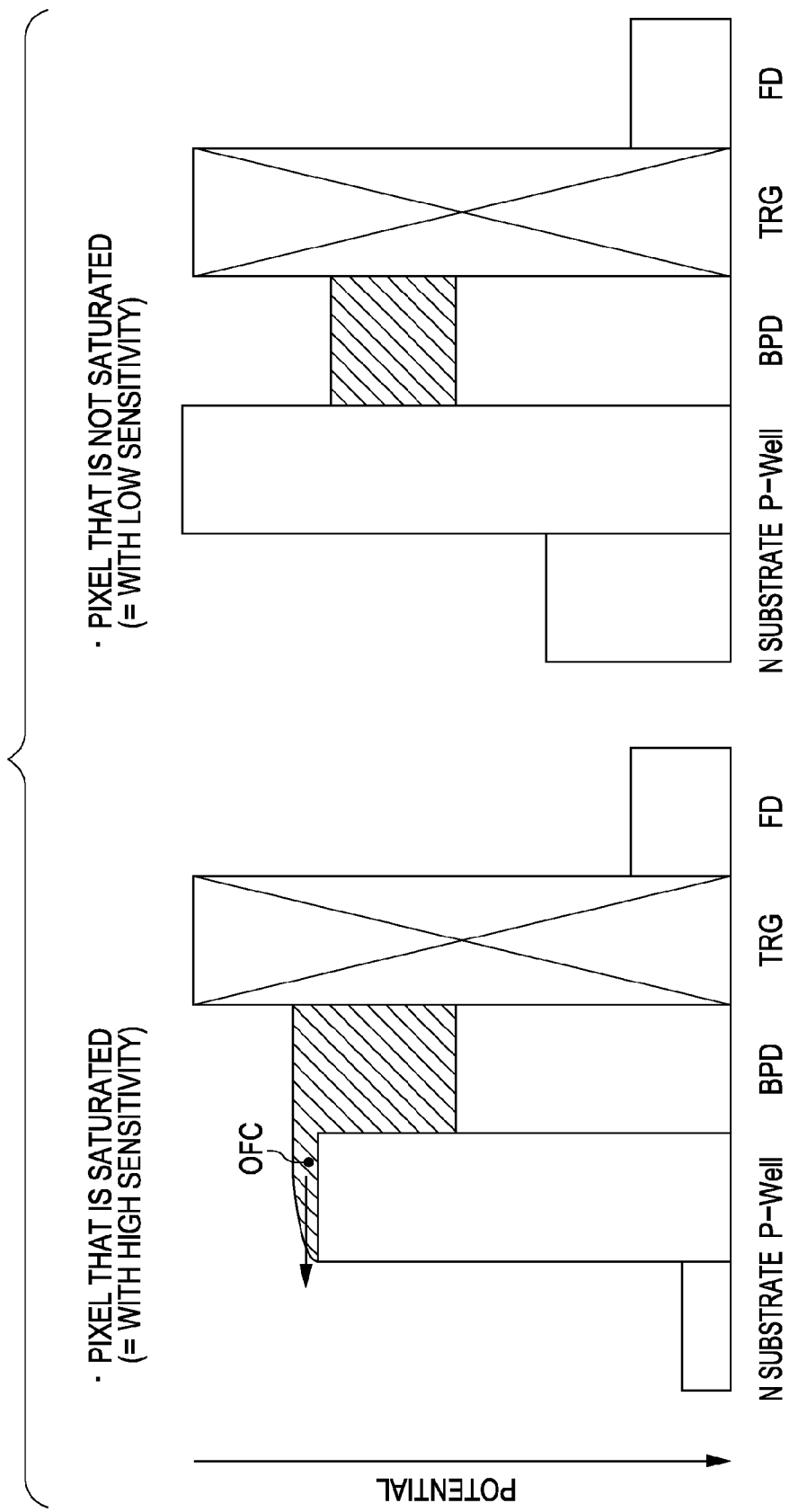
FIG. 22 includes diagrams describing the overflow path of the fifth embodiment and illustrating the potential of electrons along line XXIB-XXIB illustrated in FIG. 21A.

Also, FIG. 22 includes diagrams describing the overflow path of the fifth embodiment and illustrating the potential of electrons along line XXIB-XXIB illustrated in FIG. 21A.

As illustrated in FIGS. 21B and 22, in the fifth embodiment, the overflowing electric charge OFC is discharged to an N substrate by using a P-well and the N substrate as the overflow path OFP.

Specifically, the potential of a substrate voltage VSUB is set so that, in the P-well surrounding the BPD 111, a portion that separates N+ of the BPD 111 and the N substrate becomes the lowest.

In this way, if the electric charge accumulated in the BPD 111 exceeds a certain amount, the exceeding amount is discharged through the VOD to the N substrate.

In contrast, when the BPD 111 is used under a condition that the BPD 111 is not saturated, it is unnecessary to discharge the overflowing electric charge from the overflow path.

In such a case, the potential of the substrate voltage VSUB is set so that the potential of P-well between the BPD 111 and the N substrate becomes higher by reducing a voltage applied to the N substrate. In this way, the number of saturated electrons in the BPD 111 can be increased.

As described above, according to the fifth embodiment, the following advantages can be achieved in the CMOS image sensor whose dynamic range is extended by adding outputs from multiple BPDs with different sensitivities.

According to the fifth embodiment, even under the condition that a BPD with a high sensitivity is saturated, a correct output value can be obtained by discharging overflowing electric charge from the BPD to the power supply.

Also, by changing the potential of P-well that separates N+ of a BPD and the N substrate depending on whether the BPD is saturated or not, the number of saturated electrons in the BPD can be increased when the BPD is not saturated.

6. Sixth Embodiment

Next, a sixth embodiment of the present invention will be described.

The overall structure of a CMOS image sensor according to the sixth embodiment can be the structure illustrated in FIG. 1, as in the first embodiment.

The structure of a pixel circuit according to the sixth embodiment can be the structure illustrated in FIG. 2, as in the first embodiment.

Figure 23:
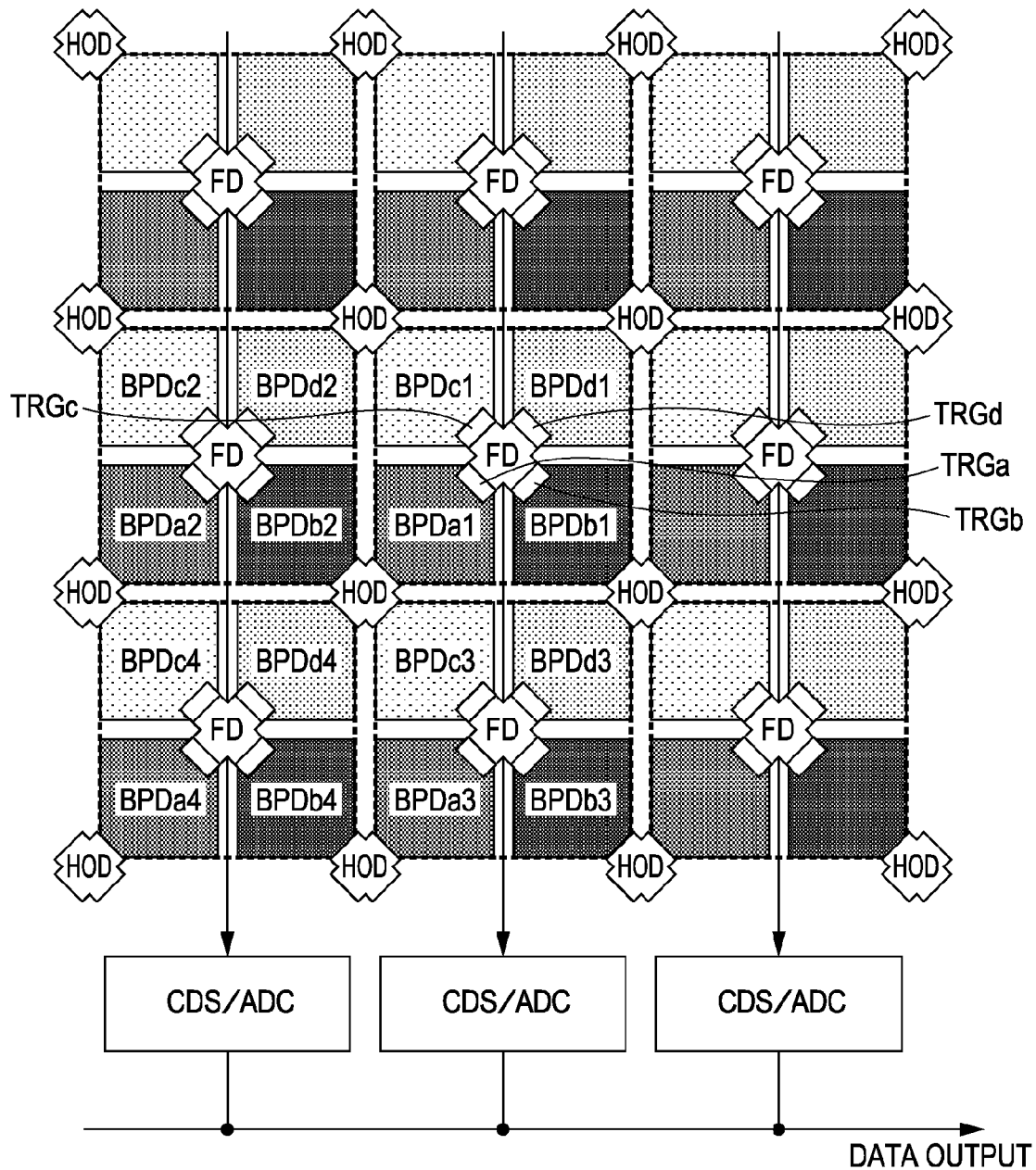
FIG. 23 is a diagram illustrating an arrangement example of a pixel circuit according to a sixth embodiment.

FIG. 23 is a diagram illustrating an arrangement example of a pixel circuit according to the sixth embodiment.

In the example in FIG. 23, the BPDs 111a to 111d are arranged in a square of 2×2 in each pixel. The floating diffusion FD is arranged in the center of the BPDs 111a to 111d. The column reading circuit 130 includes an ADC provided in each column.

The BPDs 111a to 111d have different sensitivities a to d. The sensitivities of the BPDs 111a to 111d can be changed, for example, by providing ND filters and changing the amount of incident light, or by changing the exposure time.

Signals detected by the BPDs 111a to 111d are added by an ADC in each column, and the sum signal is output. A horizontal overflow drain (HOD) that discharges overflowing electric charge is connected to each BPD 111. The HOD is shared by the adjacent BPDs 111.

In the sixth embodiment, overflowing electric charge generated in each BPD 111 is discharged by using the horizontal overflow drain (HOD) as an overflow path.

Figure 24A:
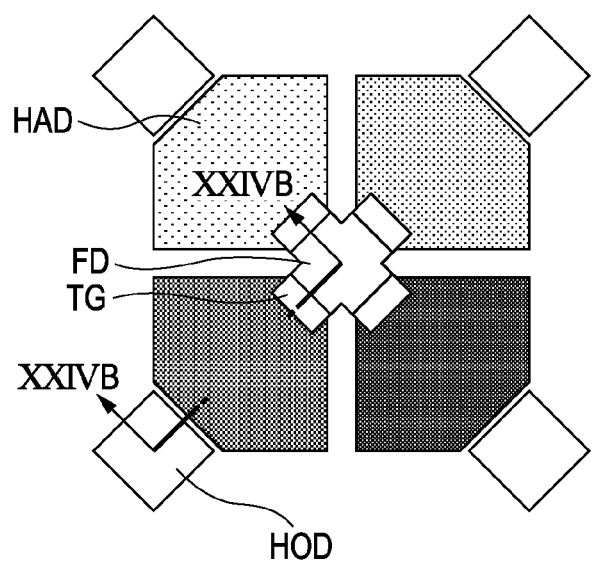
FIGS. 24A and 24B are diagrams describing an overflow path of the sixth embodiment.
Figure 24B:
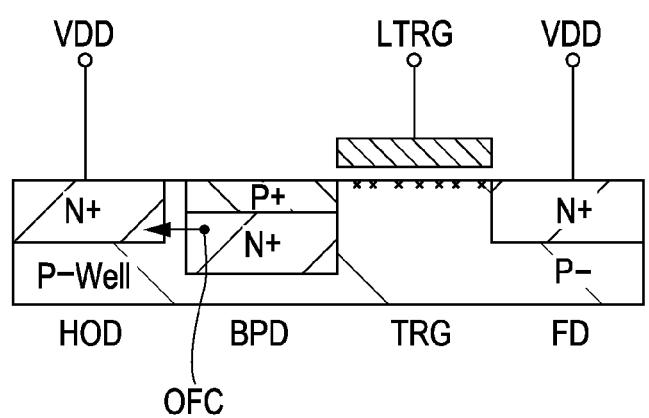

FIGS. 24A and 24B are diagrams describing an overflow path of the sixth embodiment.

FIG. 24A is a top view of a pixel according to the sixth embodiment, and FIG. 24B is a sectional view of the BPD 111, the transfer transistor (TG) 112, and the floating diffusion FD taken along line XXIVB-XXIVB illustrated in FIG. 24A.

Figure 25:
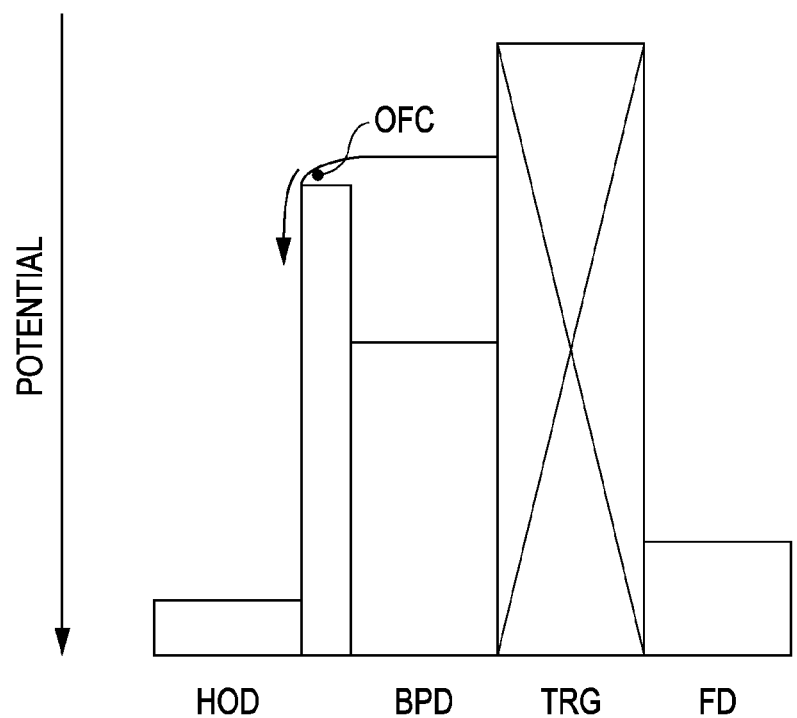
FIG. 25 is a diagram describing the overflow path of the sixth embodiment and illustrating the potential of electrons along line XXIVB-XXIVB illustrated in FIG. 24A.

Also, FIG. 25 is a diagram describing the overflow path of the sixth embodiment and illustrating the potential of electrons along line XXIVB-XXIVB illustrated in FIG. 24A.

A method of discharging overflowing electric charge in a pixel according to the sixth embodiment will be described with reference to FIG. 25.

In P-well surrounding the BPD 111, the potential of a portion that separates N+ of the BPD 111 and N+ of the HOD is the lowest.

In this way, if the electric charge accumulated in the BPD 111 exceeds a certain amount, the exceeding amount is discharged through the HOD to the N substrate.

As described above, according to the sixth embodiment, the following advantages can be achieved in the CMOS image sensor whose dynamic range is extended by adding outputs from multiple BPDs with different sensitivities.

That is, according to the sixth embodiment, even under the condition that a BPD with a high sensitivity is saturated, a correct output value can be obtained by discharging overflowing electric charge from the BPD through the horizontal overflow drain (HOD) to the power supply.

7. Seventh Embodiment

Next, a seventh embodiment of the present invention will be described.

The overall structure of a CMOS image sensor according to the seventh embodiment can be the structure illustrated in FIG. 1, as in the first embodiment.

Figure 26:
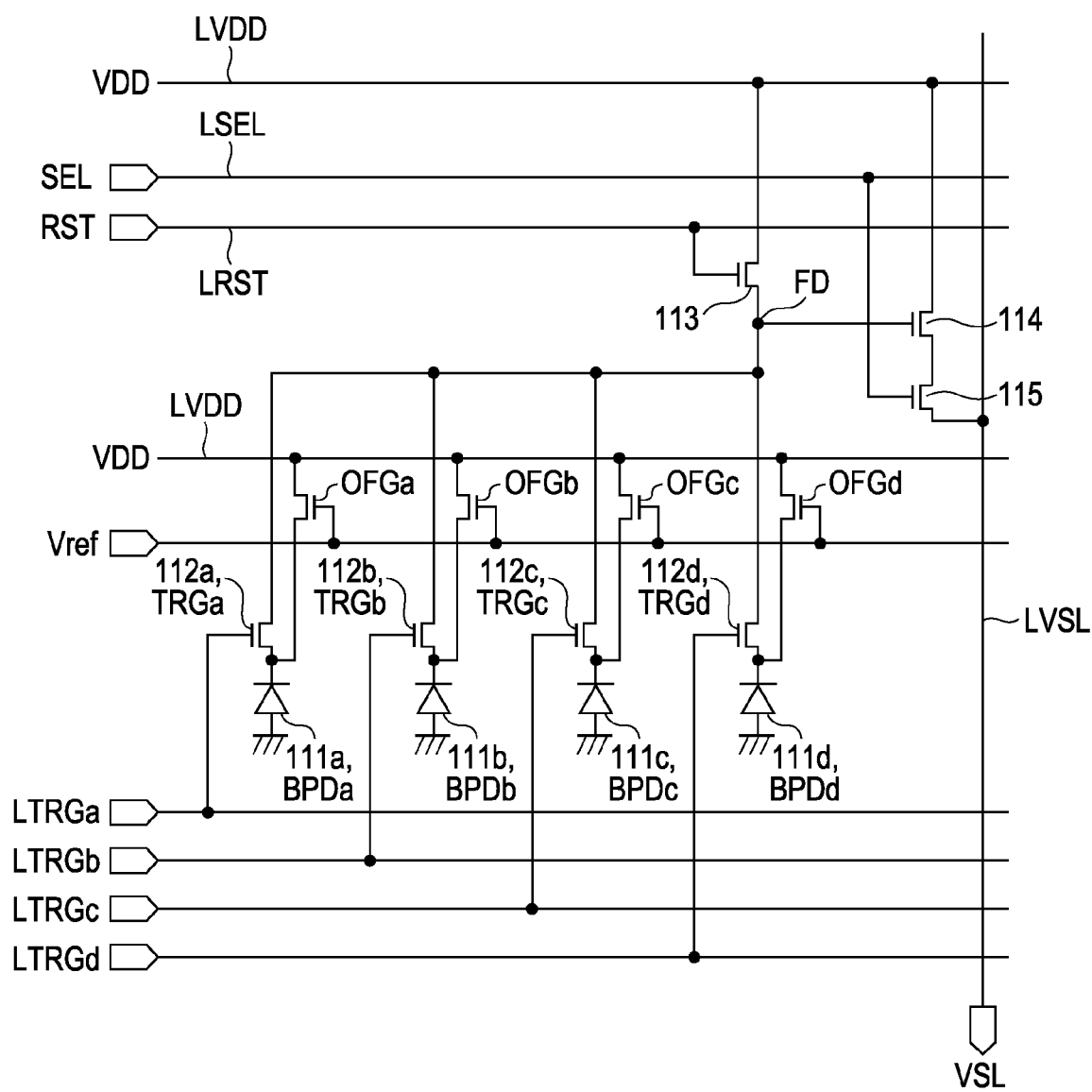
FIG. 26 is a diagram illustrating an example of a pixel circuit of a CMOS image sensor according to a seventh embodiment.

FIG. 26 is a diagram illustrating an example of a pixel circuit of the CMOS image sensor according to the seventh embodiment.

A pixel circuit 110B according to the seventh embodiment includes, in addition to the structure of the pixel circuit 110A of the first embodiment, overflow transistors 116a to 116d (OFGa to OFGd) for processing overflowing electric charge generated in the BPDs 111a to 111d.

The BPDs 111a to 111d are connected to the power supply line LVDD via the overflow transistors 116a to 116d (OFGa to OFGd), respectively. A certain potential Vref is applied to the gates of the overflow transistors 116a to 116d (OFGa to OFGd).

Figure 27:
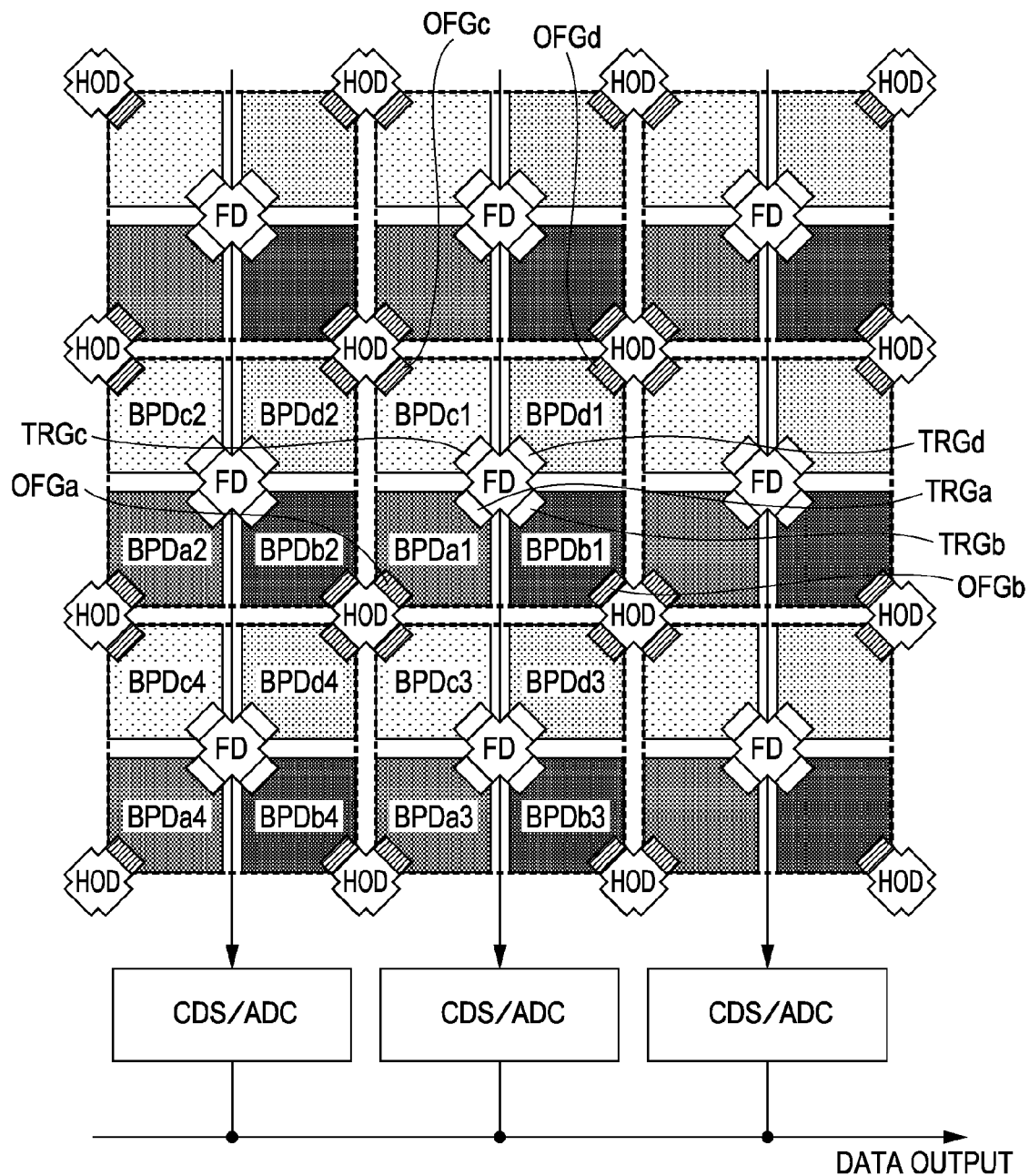
FIG. 27 is a diagram illustrating an arrangement example of the pixel circuit according to the seventh embodiment.

FIG. 27 is a diagram illustrating an arrangement example of the pixel circuit according to the seventh embodiment.

In the example in FIG. 27, the BPDs 111a to 111d are arranged in a square of 2×2 in each pixel. The floating diffusion FD is arranged in the center of the BPDs 111a to 111d. The column reading circuit 130 includes an ADC provided in each column.

The BPDs 111a to 111d have different sensitivities a to d. The sensitivities of the BPDs 111a to 111d can be changed, for example, by providing ND filters and changing the amount of incident light, or by changing the exposure time. Signals detected by the BPDs 111a to 111d are added by an ADC in each column, and the sum signal is output.

The overflow transistors 116a to 116d (OFGa to OFGd) are provided in accordance with the BPDs 111a to 111d, respectively. The overflow transistors 116a to 116d (OFGa to OFGd) each share a horizontal overflow drain (HOD) that discharges overflowing electric charge with the adjacent BPDs 111.

In the seventh embodiment, overflowing electric charge generated in each BPD 111 is discharged by using the horizontal overflow drain (HOD).

Figure 28A:
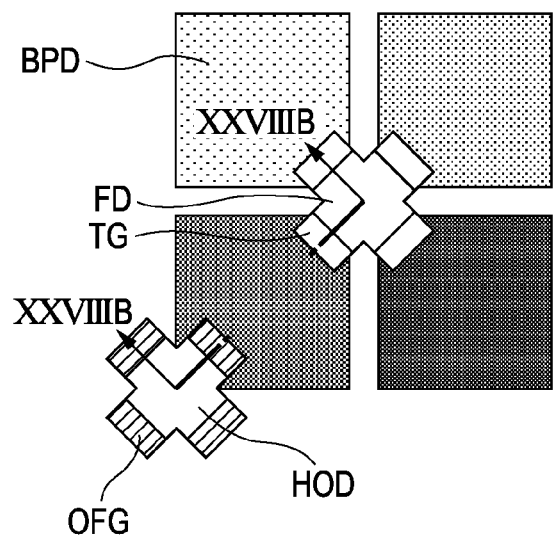
FIGS. 28A and 28B are diagrams describing an overflow path of the seventh embodiment.
Figure 28B:
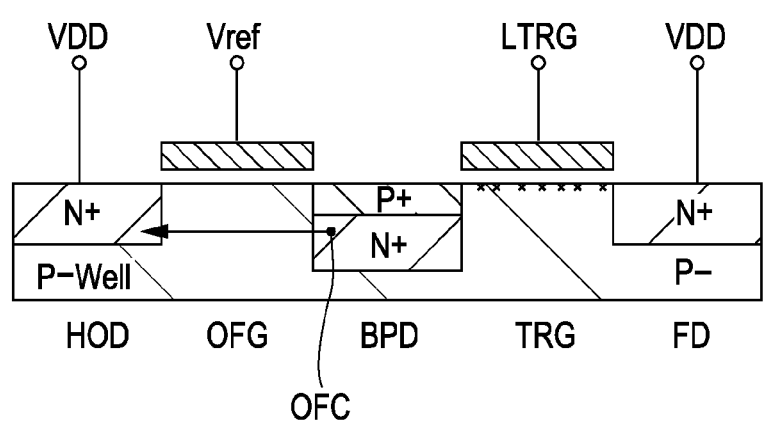

FIGS. 28A and 28B are diagrams describing an overflow path of the seventh embodiment.

FIG. 28A is a top view of a pixel according to the seventh embodiment, and FIG. 28B is a sectional view of the BPD 111, the transfer transistor (TG) 112, and the floating diffusion FD taken along line XXVIIIB-XXVIIIB illustrated in FIG. 28A.

Also, FIG. 29 includes diagrams describing the overflow path of the seventh embodiment and illustrating the potential of electrons along line XXVIIIB-XXVIIIB illustrated in FIG. 28A.

As illustrated in FIGS. 28A, 28B, and 29, in the seventh embodiment, overflowing electric charge OFC is discharged by using the overflow gate (OFG) and the horizontal overflow drain (HOD) as the overflow path OFP.

A method of discharging overflowing electric charge in a pixel according to the seventh embodiment will be described with reference to FIG. 29.

When a BPD 111 with a high sensitivity is saturated, the potential Vref applied to the gate electrode of the overflow gate (OFG) is set as follows.

That is, the potential Vref is set so that the potential of a channel of the overflow transistor 116 (OFG) becomes lower than that of a channel of the transfer transistor (TG) 112 or P-well (not illustrated).

In this way, if a potential that is of a certain amount or greater is accumulated in the BPD 111, the exceeding overflowing electric charge is discharged through the overflow transistor 116 (OFG) to the overflow drain (HOD).

In contrast, under a condition that none of the BPDs 111 is saturated, the potential of the transfer control line LTRG may be set so that the potentials of channels of the gates of the overflow transistors 116 (OFG) become higher.

In this way, the number of saturated electrons in the BPDs 111 can be increased.

As described above, according to the seventh embodiment, the following advantages can be achieved in the CMOS image sensor whose dynamic range is extended by adding outputs from multiple BPDs with different sensitivities.

According to the seventh embodiment, even under the condition that a BPD with a high sensitivity is saturated, a correct output value can be obtained by discharging overflowing electric charge from the BPD through the horizontal overflow drain (HOD) to the power supply.

Also, by changing the potential of a channel of the overflow gate of a BPD depending on whether the BPD is saturated or not, the number of saturated electrons in the BPD can be increased when the BPD is not saturated.

As described above, according to the first to seventh embodiments of the present invention, the following advantages can be achieved in the CMOS image sensors whose dynamic ranges are extended by adding outputs from multiple BPDs with different sensitivities.

According to the first and second embodiments, under the condition that a BPD with a high sensitivity is saturated, a correct output value can be obtained by discharging overflowing electric charge from the BPD to the power supply.

By using the transfer transistors and the floating diffusion FD as the overflow path, the overflowing electric charge can be appropriately processed without increasing the area.

By separating the overflow path from the transistor interface, introduction of noise due to the surface level can be prevented.

By reading signals from the BPDs in descending order of sensitivity, the overflowing electric charge can be prevented from being introduced into the floating diffusion FD, and a correct output value can be obtained.

According to the third embodiment, even under the condition that a BPD with a high sensitivity is saturated, a correct output value can be obtained by discharging overflowing electric charge from the BPD to the power supply.

By using the transfer transistors and the floating diffusion FD as the overflow path, the overflowing electric charge can be appropriately processed without reducing the size of the BPDs or the number of pixels or without increasing the chip area.

By applying a low voltage to the gate of the transfer transistor connected to a BPD with a low sensitivity, noise from the surface level of the transistor interface can be prevented from being introduced into the BPD, and a correct output value can be obtained.

Even when noise from the surface level is introduced into a BPD with a high sensitivity, a correct output can be obtained by performing a correction using the output value read from a BPD with a low sensitivity.

According to the arrangement and the driving method of the pixel circuit of the fourth embodiment, in addition to the advantages of the third embodiment, the amount of electric charge generated at the transistor interface and introduced into a BPD with a high sensitivity is reduced, thereby obtaining a correct output value.

According to the fifth embodiment, even under the condition that a BPD with a high sensitivity is saturated, a correct output value can be obtained by discharging overflowing electric charge from the BPD to the power supply.

Also, by changing the potential of P-well that separates N+ of a BPD and the N substrate depending on whether the BPD is saturated or not, the number of saturated electrons in the BPD can be increased when the BPD is not saturated.

According to the sixth embodiment, even under the condition that a BPD with a high sensitivity is saturated, a correct output value can be obtained by discharging overflowing electric charge from the BPD through the horizontal overflow drain (HOD) to the power supply.

According to the seventh embodiment, even under the condition that a BPD with a high sensitivity is saturated, a correct output value can be obtained by discharging overflowing electric charge from the BPD through the horizontal overflow drain (HOD) to the power supply.

Also, by changing the potential of a channel of the overflow gate of a BPD depending on whether the BPD is saturated or not, the number of saturated electrons in the BPD can be increased when the BPD is not saturated.

The CMOS image sensors according to the embodiments are not particularly limited. For example, the CMOS image sensors can be configured as CMOS image sensors including, for example, column-parallel ADCs.

8. Eighth Embodiment

Figure 30:
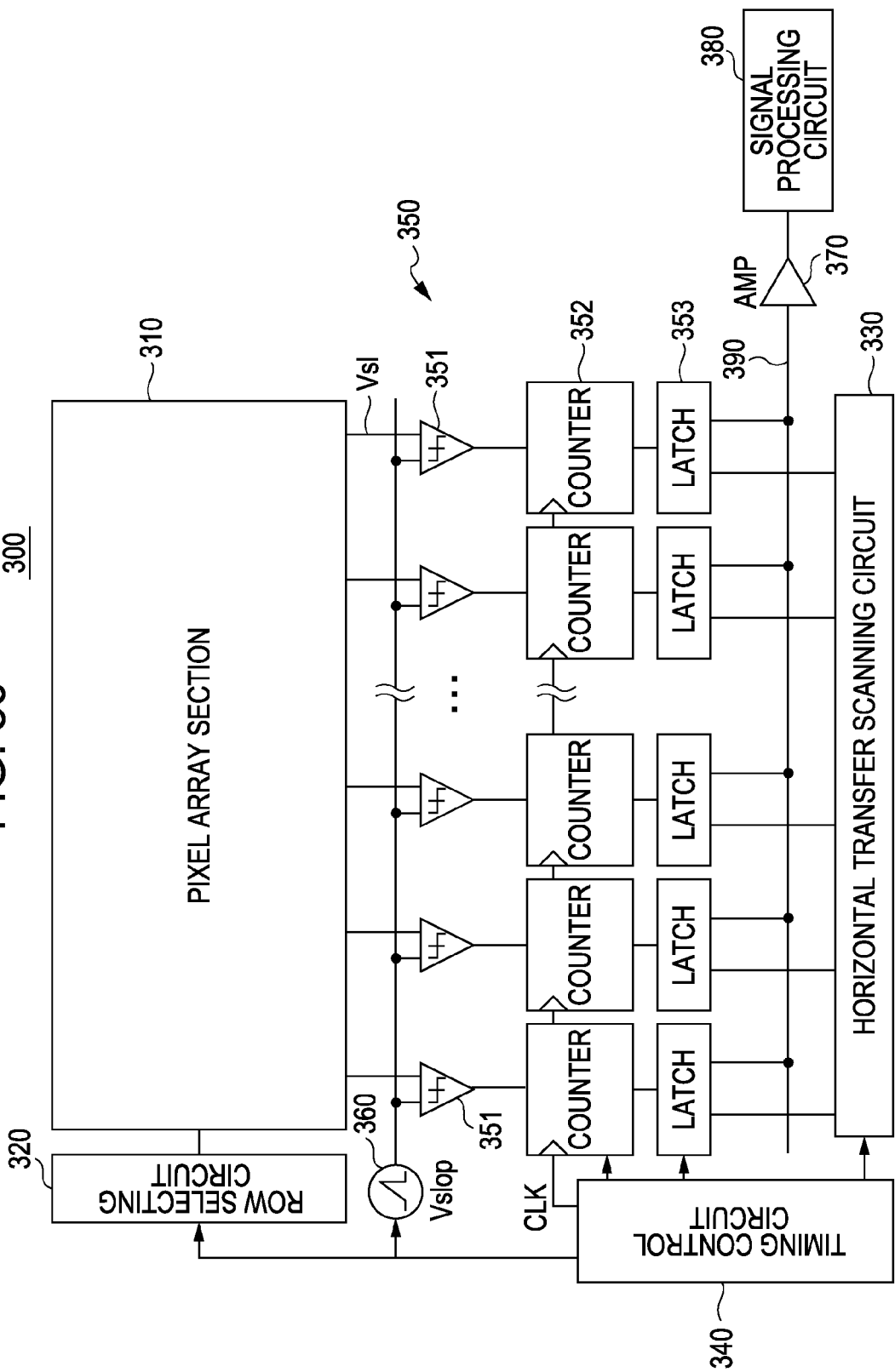
FIG. 30 is a block diagram illustrating a structure example of a solid-state image pickup device (CMOS image sensor) including column-parallel analog-to-digital converters (ADCs) according to an eighth embodiment.

FIG. 30 is a block diagram illustrating a structure example of a solid-state image pickup device (CMOS image sensor) including column-parallel ADCs according to an eighth embodiment.

As illustrated in FIG. 30, a solid-state image pickup device 300 includes a pixel array section 310 serving as an image pickup unit, a row selecting circuit 320 serving as a pixel driving unit, a horizontal transfer scanning circuit 330, and a timing control circuit 340.

The solid-state image pickup device 300 further includes an ADC group 350, a digital-to-analog converter (hereinafter abbreviated as "DAC") 360, an amplifier circuit (S/A) 370, and a signal processing circuit 380.

The pixel array section 310 is configured by arranging pixels, such as those illustrated in FIG. 2, each including a photodiode and an intra-pixel amplifier, in a matrix.

Also, in the solid-state image pickup device 300, the following circuits are arranged as control circuits for sequentially reading signals from the pixel array section 310.

That is, in the solid-state image pickup device 300, the timing control circuit 340 which generates an internal clock, the row selecting circuit 320 which controls row addresses and row scanning, and the horizontal transfer scanning circuit 330 which controls column addresses and column scanning are arranged as control circuits.

The ADC group 350 includes column-parallel ADCs, each including a comparator 351, a counter 352, and a latch 353.

The comparator 351 compares a reference voltage Vslop that is a ramp waveform (RAMP), which is obtained by changing a reference voltage generated by the DAC 360 to be a stepped voltage, with an analog signal obtained for each row line from pixels through column signal lines.

The counter 352 counts a comparison time of the comparator 351.

The ADC group 350 has an n-bit digital signal converting function and includes column-parallel ADC blocks arranged in the individual vertical signal lines (column lines).

An output of each latch 353 is connected to a horizontal transfer line 390 with, for example, an 2n-bit width.

Also, 2n amplifier circuits (S/A) 370 and signal processing circuits 380, the number of which corresponds to the horizontal transfer line 390, are arranged.

In the ADC group 350, an analog signal read to a vertical signal line (potential Vsl) is compared with a reference voltage Vslop (slope waveform that changes linearly at a certain gradient) by using the comparator 351 arranged in each column.

On this occasion, the counter 352 arranged in each column, as in the comparator 351, is operating. Since the potential Vslop with a ramp waveform and the counter value change with a one-to-one correspondence, the potential of the vertical signal line (analog signal) Vsl is converted into a digital signal.

A change of the reference voltage Vslop corresponds to conversion of a change in voltage into a change in time. That time is counted using a certain cycle (clock), thereby obtaining a digital signal.

When the analog electric signal Vsl and the reference voltage Vslop intersect, the output of the comparator 351 is inverted, and the input clock of the counter 352 is stopped. Accordingly, AD conversion is completed.

After the foregoing AD converting period is completed, the horizontal transfer scanning circuit 330 inputs data held in the latch 353 to the signal processing circuit 380 via the horizontal transfer line 390 and the amplifier circuit (S/A) 370, thereby generating a two-dimensional image.

In this manner, column-parallel output processing is performed.

The solid-state image pickup device with the foregoing advantages can be applied as an image pickup device of a digital camera or a video camera.

9. Ninth Embodiment

Figure 31:
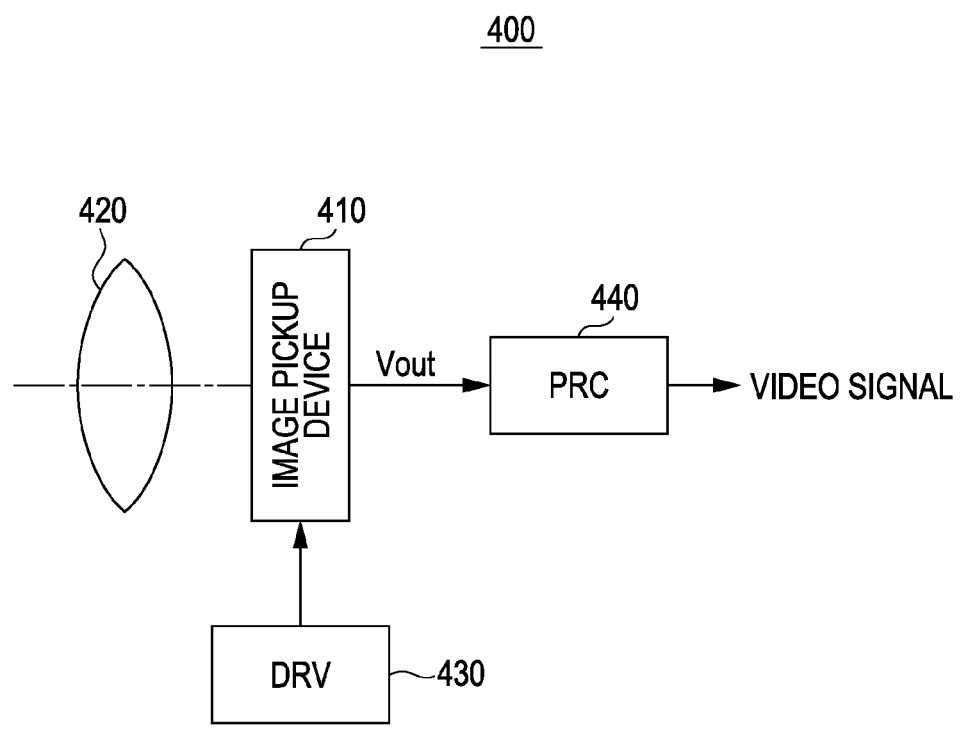
FIG. 31 is a diagram illustrating an example of the configuration of a camera system to which the solid-state image pickup device according to an embodiment of the present invention is applied.

FIG. 31 is a diagram illustrating an example of the configuration of a camera system to which a solid-state image pickup device according to an embodiment of the present invention is applied.

A camera system 400 includes, as illustrated in FIG. 31, an image pickup device 410 to which the CMOS image sensor (solid-state image pickup device) 100 or 300 according to an embodiment of the present invention is applicable.

The camera system 400 further includes an optical system that directs incident light to a pixel region of the image pickup device 410 (that forms an image of a photographic subject), such as a lens 420 that forms an image from the incident light (image light) on an image pickup face.

The camera system 400 also includes a drive circuit (DRV) 430 that drives the image pickup device 410, and a signal processing circuit (PRC) 440 that processes an output signal of the image pickup device 410.

The drive circuit 430 includes a timing generator (not illustrated in the drawings) that generates various timing signals including a start pulse that drives circuits in the image pickup device 410, and a clock pulse. The drive circuit 430 drives the image pickup device 410 using a certain timing signal.

Also, the signal processing circuit 440 applies certain signal processing to an output signal of the image pickup device 410.

An image signal processed in the signal processing circuit 440 is recorded on a recording medium, such as a memory. A hard copy of the image information recorded on the recording medium is generated using a printer or the like. Also, the image signal processed in the signal processing circuit 440 is displayed as a moving image on a monitor including a liquid crystal display or the like.

As described above, in an image pickup apparatus such as a digital still camera, a low-power consumption and highly precise camera can be realized by including the above-described image pickup device 100 or 300 as the image pickup device 410.

The present application contains subject matter related to that disclosed in Japanese Priority Patent Application JP 2009-027895 filed in the Japan Patent Office on Feb. 9, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
a pixel circuit having a plurality of unit pixels, each unit pixel including a photoelectric conversion element, a transfer element, and a reset element, the pixel circuit further including a node element; and
an overflow path provided between the photoelectric conversion element and the node element, wherein the overflow path is configured to absorb overflowing electric charge from the photoelectric conversion element through the transfer element during an on-state of the reset element occurring during an exposure period of the photoelectric conversion element, and wherein the pixel circuit is configured to read signals from a plurality of photoelectric conversion elements of the plurality of unit pixels in a descending order of sensitivity of the plurality of photoelectric conversion elements.

2. The solid-state image pickup device according to claim 1, wherein the photoelectric conversion element is configured to generate an electric charge in response to incident light.

3. The solid-state image pickup device according to claim 1, wherein the transfer element is configured to transfer an electric charge to the node element.

4. The solid-state image pickup device according to claim 1, wherein the node element is configured to amplify an electric charge transferred from the photoelectric conversion element and to output an image signal.

5. The solid-state image pickup device according to claim 1, wherein, in the exposure period, a power supply voltage is supplied to the node element, and the overflowing electric charge which has been discharged to the node element flows into a power supply.

6. The solid-state image pickup device according to claim 1, wherein a potential between the photoelectric conversion element and a transistor interface corresponding to the transfer element is highest within the overflow path.

7. The solid-state image pickup device according to claim 1, wherein the pixel circuit is configured to control turning on/off of the overflow path by controlling a gate voltage of the transfer element.

8. The solid-state image pickup device according to claim 7, wherein the overflow path is turned on only in the photoelectric conversion element where the overflowing electric charge is generated.

9. The solid-state image pickup device according to claim 1, wherein the overflow path is configured to discharge the overflowing electric charge from the plurality of photoelectric conversion elements to the node element.

10. The solid-state image pickup device according to claim 1, wherein the node element is a floating diffusion.

11. The solid-state image pickup device according to claim 1, wherein the overflow path is configured to discharge the overflowing electric charge generated in the photoelectric conversion element by using an overflow drain as the overflow path.

12. The solid-state image pickup device according to claim 1, wherein, the overflow path is configured to discharge the overflowing electric charge generated in the photoelectric conversion element by using an overflow transistor and an overflow drain as the overflow path.

13. The solid-state image pickup device according to claim 1, wherein a first depth, from a substrate front face, at which the overflow path is formed in the transfer element is deeper than a second depth, from the substrate front face, at which a transistor interface is formed.

14. A camera system comprising:
a solid-state image pickup device; and
an optical system configured to form an image of a photographic subject on the solid-state image pickup device,
wherein the solid-state image pickup device includes:
a pixel circuit having a plurality of unit pixels, each unit pixel including a photoelectric conversion element, a transfer element, and a reset element, the pixel circuit further including a node element, and
an overflow path provided between the photoelectric conversion element and the node element, wherein the overflow path is configured to absorb overflowing electric charge from the photoelectric conversion element through the transfer element during an on-state of the reset element occurring during an exposure period of the photoelectric conversion element, and wherein the pixel circuit is configured to read signals from a plurality of photoelectric conversion elements of the plurality of unit pixels in a descending order of sensitivity of the plurality of photoelectric conversion elements.

15. The camera according to claim 14, wherein the photoelectric conversion element is configured to generate an electric charge in response to incident light.

16. The camera according to claim 14, wherein the transfer element is configured to transfer an electric charge to the node element.

17. The camera according to claim 14, wherein the node element is configured to amplify an electric charge transferred from the photoelectric conversion element and to output an image signal.

18. The camera according to claim 14, wherein, in the exposure period, a power supply voltage is supplied to the node element, and the overflowing electric charge which has been discharged to the node element flows into a power supply.

19. The camera according to claim 14, wherein a potential between the photoelectric conversion element and a transistor interface corresponding to the transfer element is highest within the overflow path.

20. The camera according to claim 14, wherein the pixel circuit is configured to control turning on/off of the overflow path by controlling a gate voltage of the transfer element.

21. The camera according to claim 20, wherein the overflow path is turned on only in the photoelectric conversion element where the overflowing electric charge is generated.

22. The camera according to claim 14, wherein the overflow path is configured to discharge overflowing electric charge from a plurality of photoelectric conversion elements to the node element.

23. The camera according to claim 14, wherein the node element is a floating diffusion.

24. The camera according to claim 14, wherein the overflow path is configured to discharge the overflowing electric charge generated in the photoelectric conversion element by using an overflow drain as the overflow path.

25. The camera according to claim 14, wherein, the overflow path is configured to discharge the overflowing electric charge generated in the photoelectric conversion element by using an overflow transistor and an overflow drain as the overflow path.

26. The camera according to claim 14, wherein a first depth, from a substrate front face, at which the overflow path is formed in the transfer element is deeper than a second depth, from the substrate front face, at which a transistor interface is formed.

* * * * *